(12) United States Patent
Young et al.

(10) Patent No.: US 12,058,869 B2
(45) Date of Patent: Aug. 6, 2024

(54) SEMICONDUCTOR STRUCTURE WITH A LOGIC DEVICE AND A MEMORY DEVICE BEING FORMED IN DIFFERENT LEVELS, AND METHOD OF FORMING THE SAME

(71) Applicant: TAIWAN SEMICONDUCTOR MANUFACTURING COMPANY LTD., Hsinchu (TW)

(72) Inventors: Bo-Feng Young, Taipei (TW); Han-Jong Chia, Hsinchu (TW); Sai-Hooi Yeong, Hsinchu County (TW); Yu-Ming Lin, Hsinchu (TW); Chung-Te Lin, Tainan (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 17/837,982

(22) Filed: Jun. 10, 2022

(65) Prior Publication Data
US 2022/0302171 A1 Sep. 22, 2022

Related U.S. Application Data

(62) Division of application No. 16/904,557, filed on Jun. 18, 2020, now Pat. No. 11,362,108.

(Continued)

(51) Int. Cl.
*H10B 51/20* (2023.01)
*H01L 21/768* (2006.01)
*H01L 21/822* (2006.01)
*H01L 23/48* (2006.01)
*H01L 27/06* (2006.01)
(Continued)

(52) U.S. Cl.
CPC ....... *H10B 51/20* (2023.02); *H01L 21/76898* (2013.01); *H01L 21/8221* (2013.01); *H01L 23/481* (2013.01); *H01L 27/0688* (2013.01); *H01L 29/66795* (2013.01); *H01L 29/6684* (2013.01); *H01L 29/78391* (2014.09); *H01L 29/785* (2013.01); *H10B 10/12* (2023.02); *H10B 51/30* (2023.02); *H10B 51/40* (2023.02)

(58) Field of Classification Search
CPC ........ H10B 10/12; H10B 51/20; H10B 51/30; H10B 51/40; H01L 21/76898; H01L 21/8221; H01L 23/481; H01L 27/0688; H01L 29/66795; H01L 29/6684; H01L 29/785; H01L 29/78391
See application file for complete search history.

(56) References Cited

U.S. PATENT DOCUMENTS 11,869,965 B2 * 1/2024 Or-Bach ............. G11C 11/4097
2008/0283873 A1 * 11/2008 Yang ..................... H10B 41/40
257/E27.081

(Continued)

FOREIGN PATENT DOCUMENTS

KR    20100094905 A  *  8/2010  ......... H01L 27/0688
WO   WO-2019182657 A1  *  9/2019  ......... H01L 21/6835

*Primary Examiner* — Matthew E Warren
(74) *Attorney, Agent, or Firm* — WPAT LAW; Anthony King

(57) ABSTRACT

The present disclosure provides a semiconductor structure, including a first layer including a logic device, a second layer over the first layer including a first type memory device, and a though silicon via (TSV) electrically connecting the logic device and the first type memory device.

20 Claims, 26 Drawing Sheets

Related U.S. Application Data

(60) Provisional application No. 62/967,990, filed on Jan. 30, 2020.

(51) Int. Cl.
*H01L 29/66* (2006.01)
*H01L 29/78* (2006.01)
*H10B 10/00* (2023.01)
*H10B 51/30* (2023.01)
*H10B 51/40* (2023.01)

(56) References Cited

U.S. PATENT DOCUMENTS

| | | | |
|---|---|---|---|
| 2015/0235949 A1* | 8/2015 | Yu | H01L 25/0652 257/774 |
| 2018/0277517 A1* | 9/2018 | Kim | H10B 61/22 |
| 2020/0006388 A1* | 1/2020 | Dewey | H01L 27/0688 |
| 2021/0020628 A1* | 1/2021 | Oh | H10B 63/84 |
| 2021/0111339 A1* | 4/2021 | Chiu | H10N 70/20 |
| 2021/0118937 A1* | 4/2021 | Tsugawa | H01L 21/76275 |

* cited by examiner

SEMICONDUCTOR STRUCTURE WITH A LOGIC DEVICE AND A MEMORY DEVICE BEING FORMED IN DIFFERENT LEVELS, AND METHOD OF FORMING THE SAME

CROSS REFERENCE TO RELATED APPLICATIONS

This application claims the benefit of prior-filed U.S. non-provisional application Ser. No. 16/904,557, filed Jun. 18, 2020, which claims the benefit of prior-filed U.S. provisional application No. 62/967,990, filed Jan. 30, 2020, under 35 U.S.C. 120.

This application is related to applicant's previously filed U.S. application Ser. No. 16/798,719, filed Feb. 24, 2020, which is herein incorporated by reference.

BACKGROUND

Many modern day electronic devices include non-volatile memory. Non-volatile memory is an electronic memory that is able to store data in the absence of power. A promising candidate for the next generation of non-volatile memory is ferroelectric field effect transistor (FeFET). FeFET has a relatively simple structure and is compatible with complementary metal-oxide-semiconductor (CMOS) logic fabrication processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
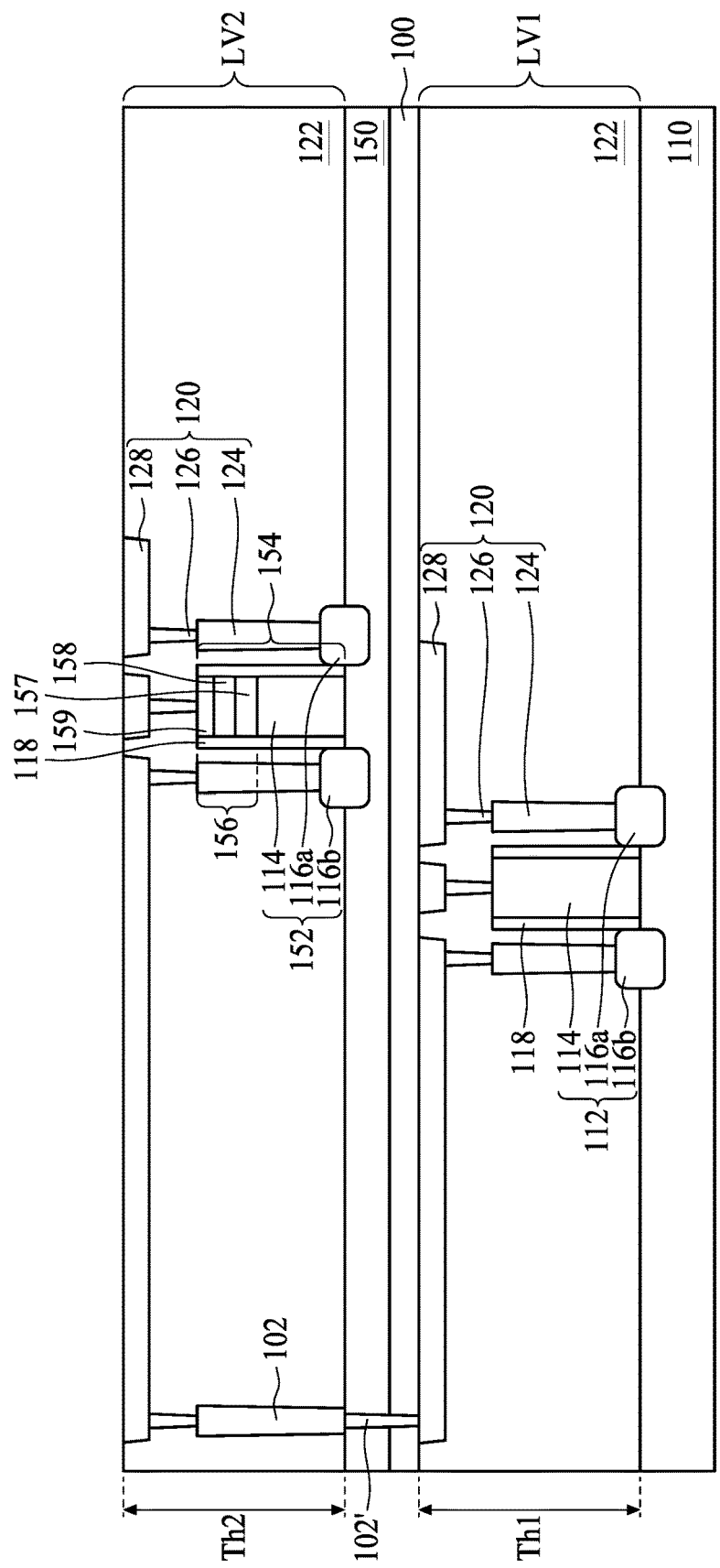
FIG. 1 is a cross-sectional view of a semiconductor structure, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Same numerical label indicates substantially identical components or values and the definition of which will be omitted.

In some existing semiconductor structures, a logic device and a memory device, such as a ferroelectric random access memory (FeRAM), are formed in the same level of integrated circuit structure. With such arrangement, FeRAM consumes valuable area footprint that logic devices could have been occupied. Shrinking the area occupied by the memory device, for example, the FeRAM, on the same level with the logic device is of primary importance to scaling down the chip size.

The present disclosure presents a semiconductor structure, in which a logic device and a memory device (e.g., a FeRAM) are formed in different levels of the integrated circuit structure. As a result, in a given area, density of the logic device and density of the memory device are more than those in the existing semiconductor structure.

In some embodiments, a first type memory device operating at a greater speed can be arranged at the same level with a logic device, and a second type memory device operating at a lower speed compared to the first type memory device can be arranged at a different level with the logic device. In some embodiments, the first type memory device includes, but not limited to, a static random access memory (SRAM), and the second type memory device includes, but not limited to, a ferroelectric random access memory (FeRAM).

FIG. 1 is a cross-sectional view of a semiconductor structure 10, in accordance with some embodiments of the present disclosure. Referring to FIG. 1, the semiconductor structure 10 includes two levels LV1 and LV2, an isolation layer 100, and a though layer via (TLV) 102. In some embodiments, the levels LV1 and LV2 are respectively denoted as a bottom layer and an upper layer of the semiconductor structure 10.

The two levels LV1 and LV2 are electrically isolated from each other by the isolation layer 100 therebetween, and the electronic components in each of the levels are electrically connected to each other through the TLV 102 penetrating the isolation layer 100, which will be described in detail below.

In some embodiments, a thickness of the isolation layer 100 ranges from about 5 nanometer to about 700 nanometer (nm). In some embodiments, the isolation layer 100 includes low-k materials. In some embodiments, the isolation layer 100 may include a silicon oxide (e.g., silicon dioxide ($SiO_2$)), a silicon-nitride based material (e.g., silicon oxynitride (SiON), a silicon oxycarbide nitride (SiOCN), a silicon carbide nitride (SiCN), oxynitride (SiN)), a silicon carbide (SiC), an aluminum oxide ($AlO_x$), or the like.

In some embodiments, the TLV 102 has a diameter ranging from about 5 nm to about 2000 nm. In some embodiments, the TLV 102 may include a portion that is a though silicon via (TSV). In some embodiments, the TLV 102 may be composed of copper (Cu), cobalt (Co), titanium nitride (TiN), tungsten (W), or the like.

Details of each of the levels LV1 and LV2 are described below.

The level LV1 includes a single crystal semiconductor layer 110 suitable for forming an electrical device with greater computing speed and an electrical circuitry controlling such electrical device The electrical device in level LV1 may include a logic device, various field effect transistors (FETs), and a high speed memory device such as an SRAM. The electrical circuitry controlling such electrical device may include peripheral circuit, input/output (I/O) circuit, and analog circuit.

In the embodiment, the single crystal semiconductor layer 110 is a semiconductor substrate processed from a silicon wafer. In some embodiments, the semiconductor substrate may include monocrystalline silicon, silicon-germanium (SiGe), silicon on insulator (SOI), or the like.

In some embodiments, the logic device includes a transistor 112. For brevity, only one transistor 112 is depicted in FIG. 1. However, the present disclosure is not limited thereto. Moreover, in some embodiments, the level LV1 may include other transistors 112 in the regions of analog circuit, I/O circuit, and the SRAM.

The transistor 112 includes a gate 114, and a pair of source/drain regions (i.e., a conductive region) 116a, 116b. In some embodiments, the transistor 112 includes a FinFET structure.

In some embodiments, the pair of source/drain regions 116a, 116b is partially disposed in the single crystal semiconductor layer 110 as a result of an epitaxial growth. The source/drain regions 116a, 116b may abut the gate 114, and protrudes toward the level LV2 so that a top surface of the pair of source/drain regions 116a and 116b is not leveled with and higher than that of the single crystal semiconductor layer 110.

In addition, the layer LV1 further includes a pair of sidewall spacers 118, an interconnection 120, and an interlayer dielectric (ILD) structure 122. The pair of sidewall spacers 118 is disposed on opposite sides of the gate 114 for electrical isolation and position control of the source/drain regions 116a, 116b. The interconnection 120 is disposed in the ILD structure 122, and is configured for electrically connecting the electrical signal from the transistor 112 in the first level LV1 to the transistor structure 152 in the second level LV2. In some embodiments, the ILD structure 122 may include one or more stacked dielectric layers, which may respectively include a low-k dielectric (e.g., a dielectric material with a dielectric constant less than about 3.9).

The interconnection 120 includes a conductive plug 124, a conductive via 126, and a conductive line 128. The conductive plug 124 extends in a direction along which the levels LV1 and LV2 are arranged, and is disposed on the pair of source/drain regions 116a and 116b. The conductive via 126 extends in a direction along which the levels LV1 and LV2 are arranged, and is disposed on the conductive plug 124. The conductive line 128 extends on a plane perpendicular to a direction along which the levels LV1 and LV2 are arranged, is disposed on the conductive via 126, and is disposed beneath the isolation layer 100. For simplicity, one pair of the conductive via 126 and the conductive line 128 is depicted. However, the present disclosure is not limited to one pair. In some embodiments, the layer LV1 may include a plurality of pairs of the conductive via 126 and the conductive line 128, depending on design choice.

The level LV2 includes a semiconductor layer stacking over the isolation layer 100. In some embodiments, the semiconductor layer may include a polysilicon layer 150 suitable for forming an electrical device with lower computing speed than that in the first level LV1. An active region of the electrical device is defined in the polysilicon layer 150, and the polysilicon layer 150 serves as a channel layer. Such electrical device may be a memory such as an FeRAM. Note the memory in the second level LV2 may be a different type of memory in the first level LV1 with different demand on material quality. For example, the memory device disposed in the first level LV1 requires a single crystal channel and the memory device disposed in the second level LV2 can operate without compromising its performance by having a polycrystalline channel.

In some embodiments, a thickness of the polysilicon layer 150 ranges from about 100 nm to 500 nm. In some embodiments, the semiconductor layer stacking over the isolation layer 100 may include an amorphous layer, such as an amorphous silicon layer.

The electronic device in the second level LV2 includes a transistor structure 152 and a gate structure 154. The transistor structure 152 is similar to that of the transistor 112 in the layer LV1 except that, for example, a memory device is integrated in the gate structure 154. The gate structure 154 includes a gate 114 and a polarization switching structure 156 of a FeRAM.

The polarization switching structure 156 of the FeRAM is disposed in the gate structure 154. A pair of sidewall spacers 118 is disposed on opposite sides of the gate 114 and the polarization switching structure 156 for electrical isolation and position control of the source/drain regions 116a, 116b. The polarization switching structure 156 functions to store data. For example, the polarization switching structure 156 may switch between a first polarization state (e.g., negative remnant (−Pr) polarization state), which corresponds to a binary value of "1," and a second polarization state (e.g., positive remnant (+Pr) polarization state), which corresponds to a binary value of "0," or vice versa. In some embodiments, a positive voltage pulse is applied to the gate 114 to switch to the first polarization state, and a negative voltage pulse is applied to the gate 114 to switch to the second polarization state, or vice versa.

The polarization switching structure 156 includes a conductive structure 157, a ferroelectric structure 158, and a conductive structure 159.

The conductive structure 157 is disposed on the gate 114, and serves as a bottom electrode. In some embodiments, a thickness of the conductive structure 157 ranges from about 2 nm to about 20 nm. In some embodiments, the conductive structure 157 may be composed of metal (e.g., ruthenium (Ru), gold (Au), platinum (Pt), nickel (Ni), iridium (Ir), Ta, Ti, Al, Cu, W, or the like), metal-nitride (e.g., tantalum nitride (TaN), TiN, or the like), metal-oxide (e.g., iridium oxide ($IrO_2$)), doped polysilicon (e.g., n-type/p-type polysilicon), or the like.

The ferroelectric structure 158 is disposed over the conductive structure 157. In some embodiments, a thickness of the ferroelectric structure 158 ranges from about 2 nm to about 20 nm. In some embodiments, the ferroelectric structure 158 may include one of hafnium zirconium oxide ($HfZrO_2$) and hafnium dioxide ($HfO_2$), which are doped by lanthanum (La), yttrium (Y), gadolinium (Gd), strontium (Sr), Si, Al, Ge, or the like. In some embodiments, the ferroelectric structure 158 may include aluminum scandium nitride (AlScN), BaTiOx, BaSrTiOx, $PbZrxTiyO_Z$, or the like. In some embodiments, the ferroelectric structure 158 may include one or more layers of, for example, metal-oxide (e.g., hafnium oxide ($Hf_XO_Y$)), component-metal-oxide (e.g., hafnium-silicon-oxide ($Hf_XSi_YO_Z$), hafnium-aluminum-oxide ($Hf_XAl_YO_Z$), hafnium-gadolinium-oxide ($Hf_XGd_YO_Z$), hafnium-zirconium-oxide ($Hf_XZr_YO_Z$), hafnium-lanthanum-oxide ($Hf_XLa_YO_Z$), hafnium-strontium-oxide ($Hf_XSr_YO_Z$), hafnium-yttrium-oxide ($Hf_XY_YO_Z$), strontium titanate (STO), etc.), a metal-oxynitride (e.g., hafnium oxynitride ($Hf_XO_YN_Z$)), or the like The conductive structure 159 is disposed over the ferroelectric structure 158, and serves as a top electrode. In some embodiments, a thickness of the conductive structure 159 ranges from about 2 nm to about 20 nm. In some embodiments, the conductive structure 159 may a metal (e.g., Ru, Au, Pt, Ni, Tr, Ta, Ti, Al, Cu, W, or the like), a metal-nitride (e.g., TaN, TiN, or the like), a metal-oxide (e.g., $IrO_2$), doped polysilicon (e.g., n-type/p-type polysilicon), or the like.

In addition, as previously discussed in the level LV1, the level LV2 also includes an interconnection 120 and an ILD structure 122. The interconnection 120 includes a conductive plug 124 and a conductive via 126. The interconnection 120 is disposed in the ILD structure 122, and is configured for electrically connecting the electrical signal from the transistor structure 152 in the second level LV2 to the transistor 112 in the first level LV1. In some embodiments, the ILD structure 122 may include one or more stacked dielectric layers, which may respectively include a low-k dielectric (e.g., a dielectric material with a dielectric constant less than about 3.9). In some embodiments, the conductive via 126 connected to the regions 116a and 116b may serve as a bit line of the memory device, and the conductive via 126 connected to the polarization switching structure 156 may serve as a word line of the memory device.

As previously discussed, the transistor 112 in the level LV1 is coupled to the transistor structure 152 in the level LV2 through the interconnections 120 in the levels LV1 and LV2, and the TLV 102 which penetrates the isolation layer 100 and the polysilicon layer 150.

In some embodiments, the level LV1 has a thickness Th1. The thickness Th1 may be a thickness of the ILD structure 122. The level LV2 has a thickness Th2. The thickness Th2 can be a thickness of the ILD structure 122. In some embodiments, a process of forming the level LV1 is similar to that of forming the level LV2, which will be described in detail with reference to FIGS. 5 to 26. As a result, a thickness Th1 of the level LV1 substantially equals to a thickness Th2 of the level LV2.

In the present embodiment, a logic device and an FeRAM are disposed at different levels of the semiconductor structure 10. Competition for area footprint between the transistors 112 of the logic device and the transistor structure 152 of the memory device is avoided. As a result, the density of the logic device and the density of the memory device can be doubled per unit area of the semiconductor structure 10.

Figure 2:
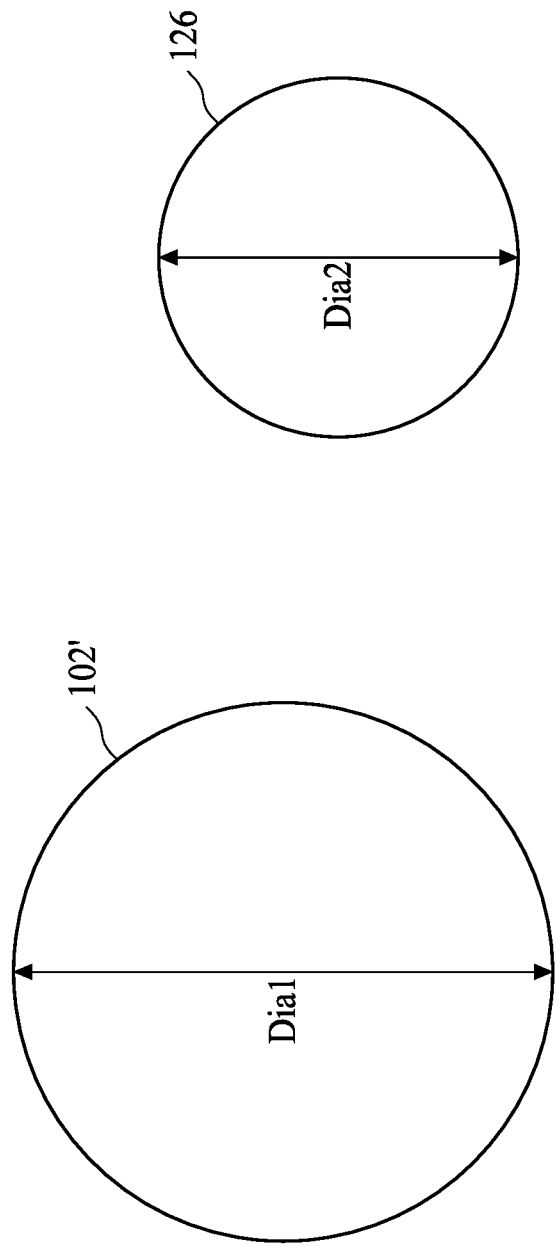
FIG. 2 is a diagram showing a top view of a through layer via (TLV) and a conductive via in FIG. 1.

FIG. 2 is a diagram showing a top view of the lower portion of the TLV 102' and the conductive via 126 in FIG. 1. Referring to FIG. 1 and FIG. 2, the lower portion of the TLV 102' penetrates the polysilicon layer 150 and the isolation layer 100 and has a diameter Dia1. The conductive via 126 is a portion of the interconnect 120 and has a diameter Dia2. In some embodiments, the diameter Dia1 can be in a range of from about 5 nm to about 2000 nm, depending on the thickness of the polysilicon layer 150 and the isolation layer 100, and the diameter Dia 2 can be in arrange of from about 10 nm, depending on the line width capability current art. Alternatively speaking, the diameter Dia1 is generally greater than the diameter Dia 2.

Figure 3:
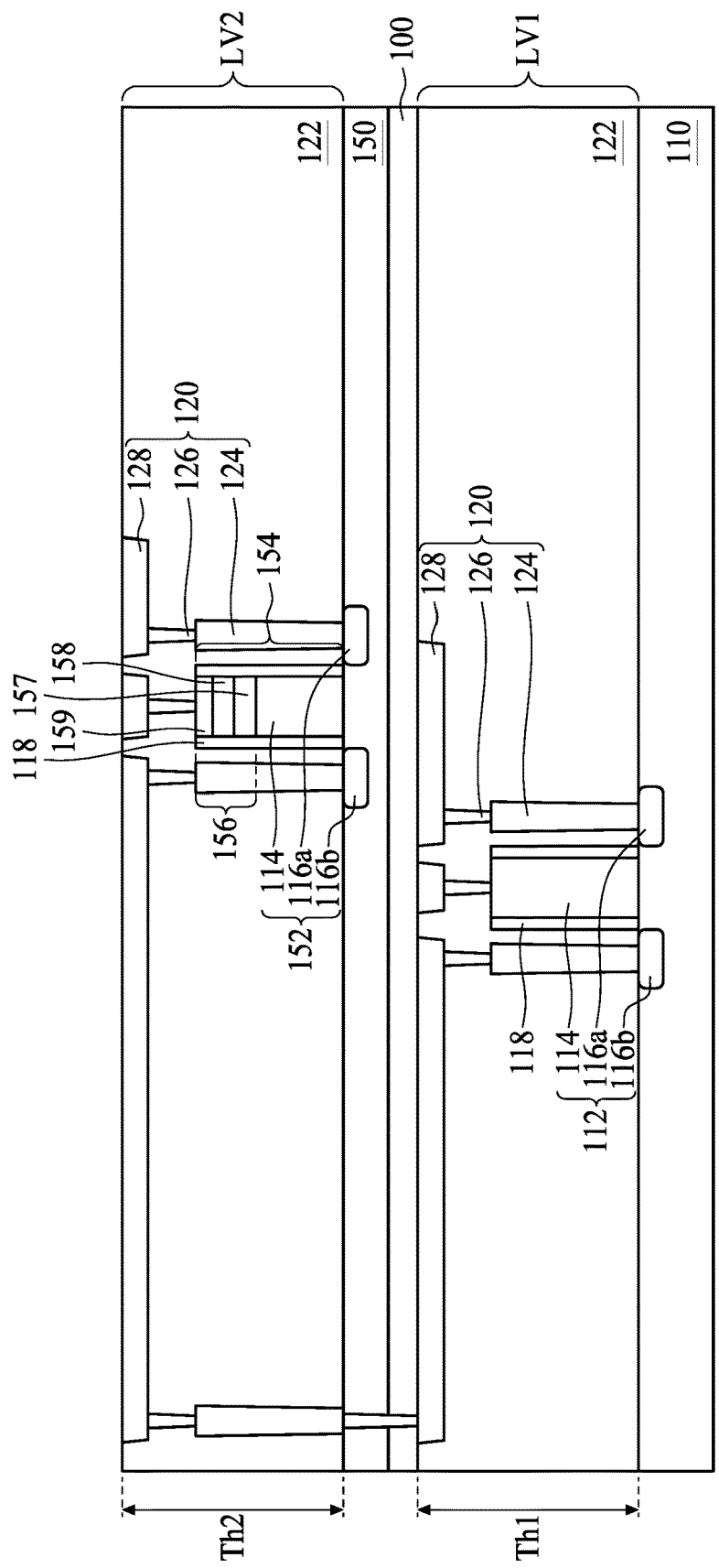
FIG. 3 is a cross-sectional view of a semiconductor structure, in accordance with some embodiments of the present disclosure.

FIG. 3 is a cross-sectional view of a semiconductor structure 30, in accordance with some embodiments of the present disclosure. Referring to FIG. 3, the semiconductor structure 30 is similar to the semiconductor structure 10 illustrated and described with reference to FIG. 1 except that, for example, the pair of source/drain regions 116a, 116n is disposed in the polysilicon layer 150, or in the single crystal semiconductor layer 110. For example, the pair of source/drain regions 116a, 116b is formed by suitable implantation operations.

Figure 4:
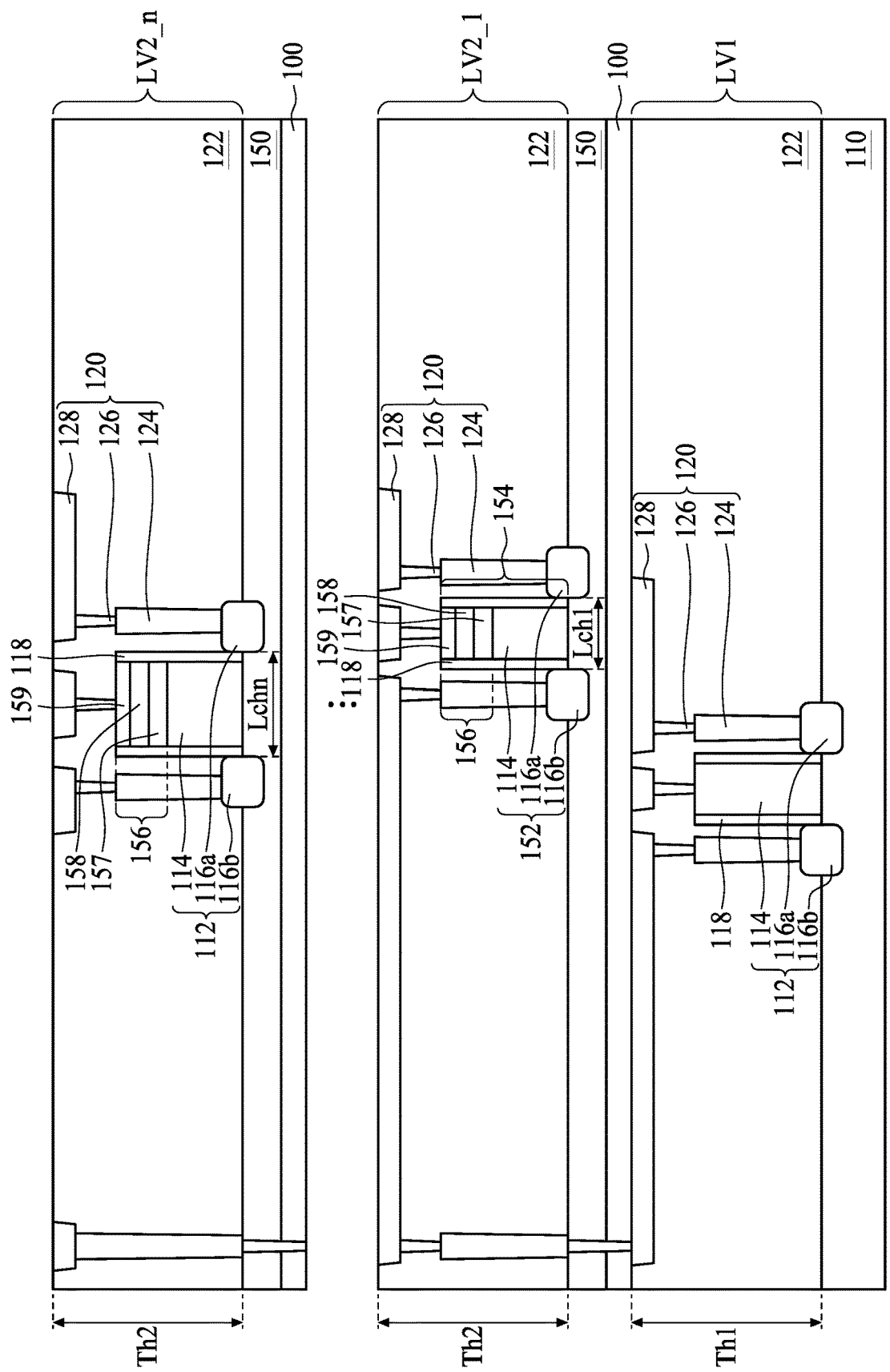
FIG. 4 is a cross-sectional view of a semiconductor structure, in accordance with some embodiments of the present disclosure.

FIG. 4 is a cross-sectional view of a semiconductor structure 40, in accordance with some embodiments of the present disclosure. Referring to FIG. 4, the semiconductor structure 40 is similar to the semiconductor structure 10 described and illustrated with reference to FIG. 1 except that, for example, the semiconductor structure 40 includes a plurality of stacked levels including LV2_1 to LV2_n, wherein n is a positive integer greater than one.

The layer LV2_n represents a top level among all levels. Due to constraint of semiconductor manufacturing technologies, a channel length Lchn of the layer LV2_n is generally longer than a channel length Lch1 of the layer LV2_1, and the line width of the interconnect 120 in the level LV2_n is greater than the line width of the interconnect 120 in the lower levels.

Integrating the polarization switching structure 156 with the gate structure 154 of the transistor structure 152 of the memory device free the space over the transistor structure 152 which would otherwise be used to dispose a trace for connecting a gate 114 of a transistor to a polarization switching structure over the transistor 152. As a result, density of the FeRAM can be multiplied based on the number of levels implemented.

Figure 5:
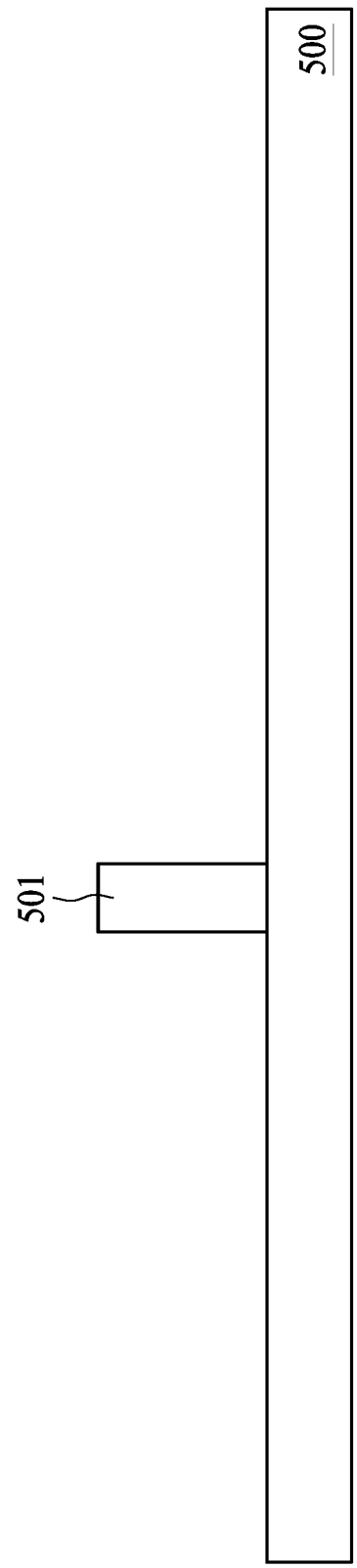
FIGS. 5 to 26 illustrate cross-sectional views of a semiconductor structure during intermediate manufacturing operations, in accordance with some embodiments of the present disclosure.

FIGS. 5 to 26 illustrate cross-sectional views of a semiconductor structure during intermediate manufacturing operations, in accordance with some embodiments of the present disclosure Referring to FIG. 5, a semiconductor substrate 500 is provided. The semiconductor substrate 500 can be a silicon wafer with an epitaxial top surface. The substrate 500 may include a silicon wafer with a silicon epitaxial top surface, a silicon wafer with SiGe epitaxial top surface, a silicon on insulator (SOI) wafer, or a III-V semiconductor wafer. A sacrificial gate 501 may be formed over the semiconductor substrate 500 by, for example, depositing a processing layer followed by a patterning process. In some embodiments, the sacrificial gate 501 includes polysilicon. The processing layer is formed by, for example, deposition or growth by means of chemical vapor deposition (CVD), physical vapor deposition (PVD), atomic layer deposition (ALD), epitaxy, sputtering, or some other deposition or growth process. Subsequently, the sacrificial gate 501 is formed by patterning the processing layer. In some embodiments, forming the sacrificial gate 501 includes forming a masking layer over/on the processing layer and patterning the processing layer according to the masking layer by an etch (e.g., wet/dry etch). The etch removes unmasked portions of the processing layer, thereby forming the sacrificial gate 501. Subsequently, the masking layer may be stripped away.

In some embodiments, prior to the formation of the sacrificial gate 501, a gate dielectric (not shown in FIG. 6) is formed on the semiconductor substrate 500. The gate dielectric may include, for example, an oxide (e.g., $SiO_2$), a high-k dielectric material (e.g., $HfO_2$, $ZrO_2$, or some other dielectric material with a dielectric constant greater than about 3.9), or a combination thereof.

Figure 6:
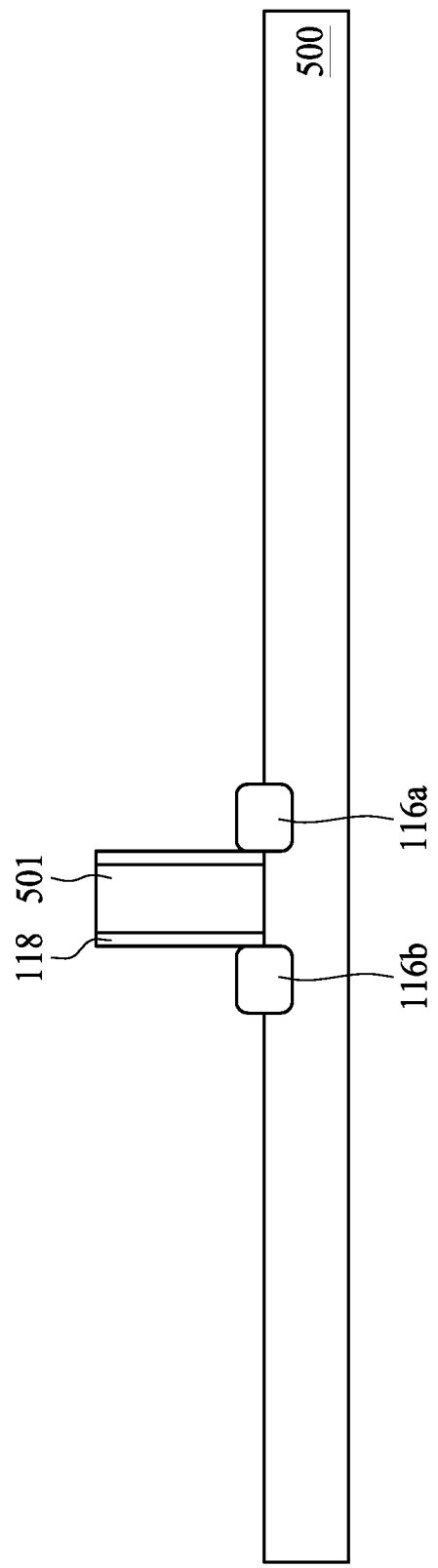

Referring to FIG. 6, a sidewall spacer 118 is formed over the semiconductor substrate 500 in FIG. 5 and along sidewalls of the sacrificial gate 501. A spacer layer may be first blanket deposited by PVD, CVD, ALD, sputtering, or some other deposition process. In some embodiments, the spacer layer may include nitride (e.g., SiN), oxynitride (e.g., $SiO_xN_y$), or the like. Subsequently, a patterning operation is performed to remove the portion of the spacer layer from horizontal surfaces, leaving the spacer layer along sidewalls of the sacrificial gate 501.

A pair of source/drain regions 116a, 116b are formed at least partially in the substrate 110 by, for example, forming a recess in the semiconductor substrate 500 immediately adjacent to the sacrificial gate 501 and the sidewall spacer 118, and growing an epitaxial layer filling off and protruding over the recess. In some embodiments, the epitaxial growth of the source/drain regions 116a, 116b is in-situ doped. However, the present disclosure is not limited thereto. In some embodiments, the pair of source/drain regions 116a, 116b are formed in the semiconductor substrate 500 by, for example, various ion implantation operations.

Figure 7:
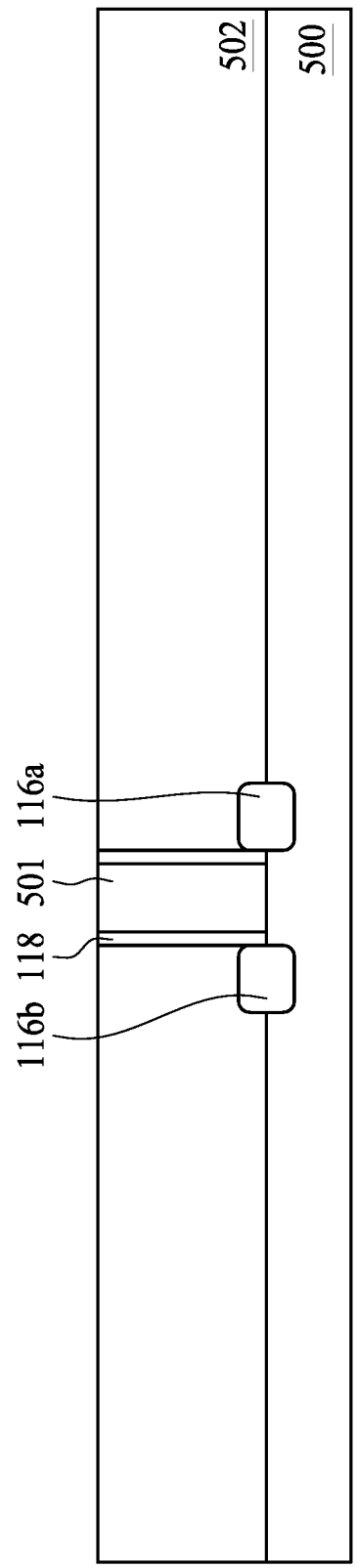

Referring to FIG. 7, a first interlayer dielectric (ILD) structure 502 is formed over the substrate 500 by, for example, depositing dielectric materials over the substrate 500, the sidewall spacer 118, and the sacrificial gate 501, followed by a planarization process (e.g., a chemical-mechanical planarization (CMP)) performed on a top of the dielectric materials. The process of dielectric materials deposition may include CVD, PVD, or other suitable operations.

Figure 8:
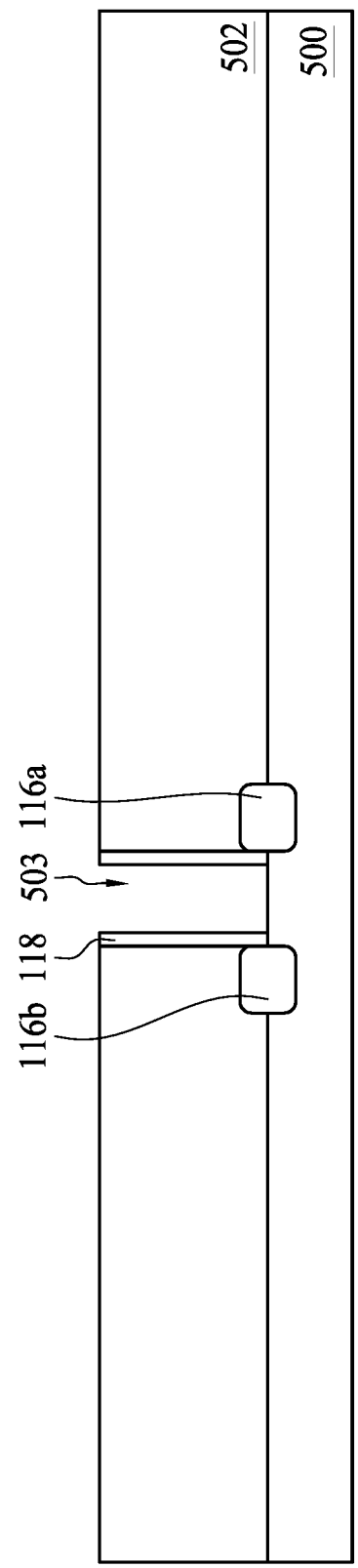

Referring to FIG. 8, an opening 503 is formed by removing the sacrificial gate 501 in FIG. 7, exposing a surface of the semiconductor substrate 500. The opening 503 may be defined by inner sidewalls of the sidewall spacer 118 and the exposing the semiconductor substrate 500. In some embodiments, a process for removing the sacrificial gate 501 includes performing an etch (e.g., dry or wet etch) to selectively remove the sacrificial gate 501. In further embodiments, before the etch, a masking layer (not shown) may be formed covering the first ILD structure 502 and the sidewall spacer 118, while leaving the sacrificial gate 501 exposed. Thereafter, the etch is performed with the masking layer in place, thereby selectively removing the sacrificial gate 501. Subsequently, the masking layer may be stripped away.

Figure 9:
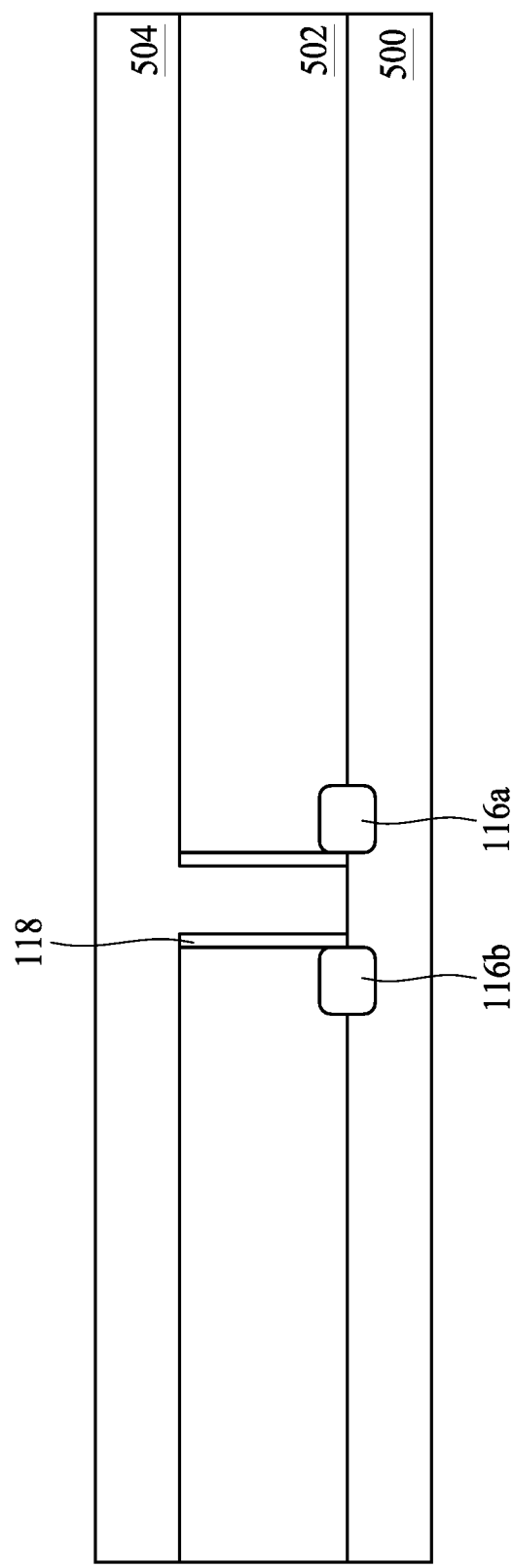

Referring to FIG. 9, a gate electrode layer 504 is formed by filling the opening 503 in FIG. 8 and over the first ILD structure 502 with gate electrode material. The gate electrode layer 504 may include work function metal and other conductive materials such as W, Al, Ti, Mo, TiN, TaN, or the like. The gate electrode layer 504 can be a multi-layer structure. In some embodiments, the process of forming the gate electrode layer 504 may include CVD, PVD, ALD, sputtering, electrochemical plating, electroless plating, or some other deposition process. The process of removing the sacrificial gate 501 and replacing with the gate electrode layer 504 as described above may be referred to as a replacement gate process or a gate-last high-k/metal gate (HKMG) process.

Figure 10:
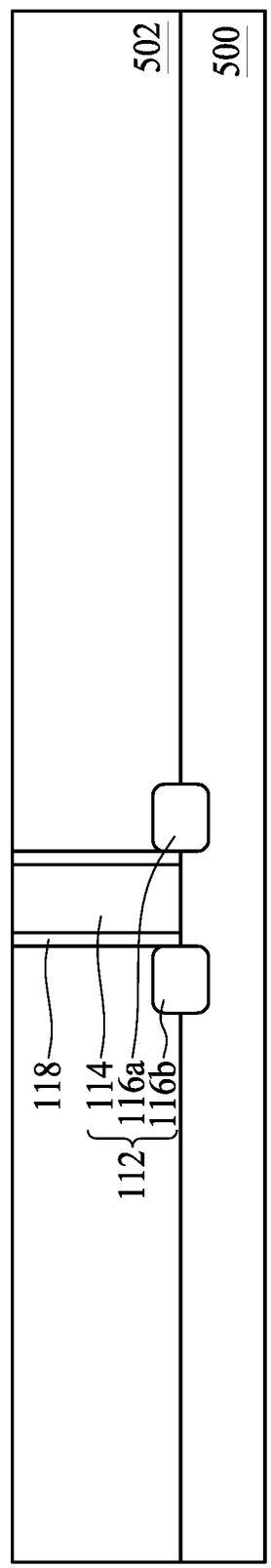

Referring to FIG. 10, a gate 114 is formed by removing the excess gate electrode layer 504 over the ILD structure 502 so that the gate 114 may be coplanar with a top surface of the ILD structure 502. As a result, the gate 114 and the pair of source/drain regions 116a, 116b defining a transistor 112 is formed over the semiconductor substrate 500. In some embodiments, the channel of the transistor 112 is located in the intrinsic body of the semiconductor substrate 100, for example, a monocrystalline silicon layer. The channel of the transistor 112 may be lightly doped or undoped.

It will be appreciated that, in some embodiments, the gate 114 may be formed by other processes. For example, the gate 114 may be formed by a gate-first HKMG process (e.g., the metal gate electrode is formed prior to source/drain formation), a fully silicided (FUSI) metal gate process (e.g., fully siliciding a polysilicon gate), or a doped polysilicon gate process (e.g., self-aligned polysilicon gate process). Depending on the process in which the gate 114 is formed, the processing layer may comprise, for example, doped polysilicon (e.g., n-type/p-type polysilicon), undoped polysilicon, a metal (e.g., W, Al, Ti, Mo, or the like), a metal-nitride (e.g., TiN, TaN, or the like), other conductive material, or a combination thereof.

Figure 11:
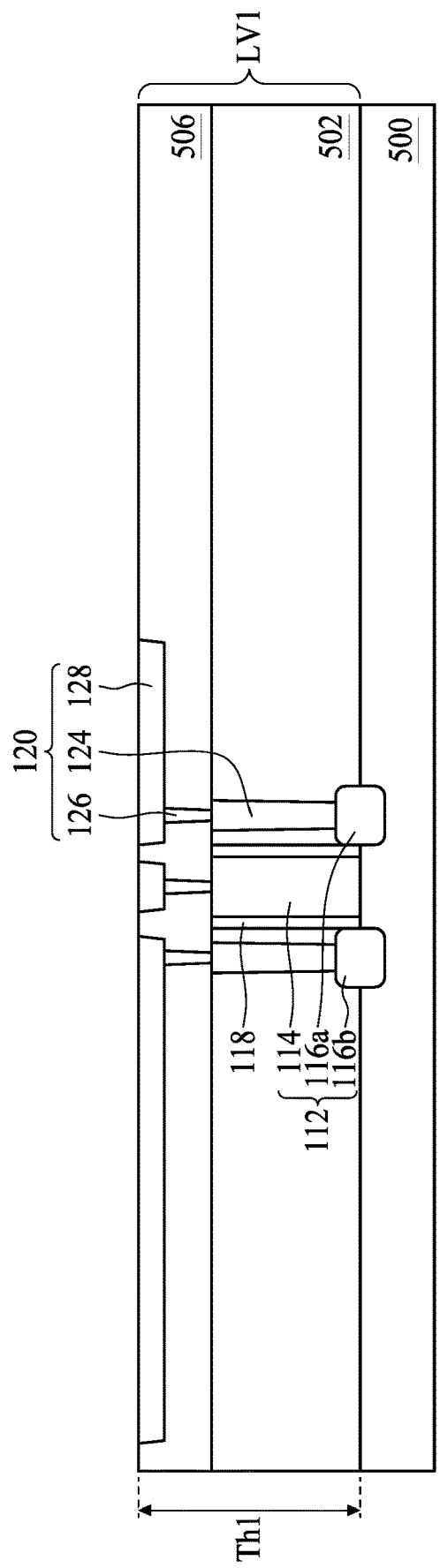

Referring to FIG. 11, the first ILD structure 502 is patterned to for conductive plugs 124 connecting to the pair of source/drain regions 11a, 116b. A second ILD structure 506 is formed over the first ILD structure 502 and patterned with a plurality of conductive vias 126 and a plurality of conductive lines 128.

The conductive plugs 124, the conductive vias 126, and the conductive lines 128 are electrically coupled together in a predefined manner and configured to provide electrical connections between various devices disposed throughout the logic region and the periphery region. In the following discussion, the conductive plugs 124, the conductive vias 126, the conductive lines 128, the first ILD structure 502, and the second ILD structure 506 may be a portion of the components disposed in the level LV1. The level LV1 can be measured with a thickness Th1 from the bottom of the first ILD structure 502 to the top of the second ILD structure 506 surrounding the conductive lines 128 and conductive vias 126. The first ILD structure 502 and the second ILD structure 506 will be referred to as an ILD structure 502' in FIG. 12.

Figure 12:
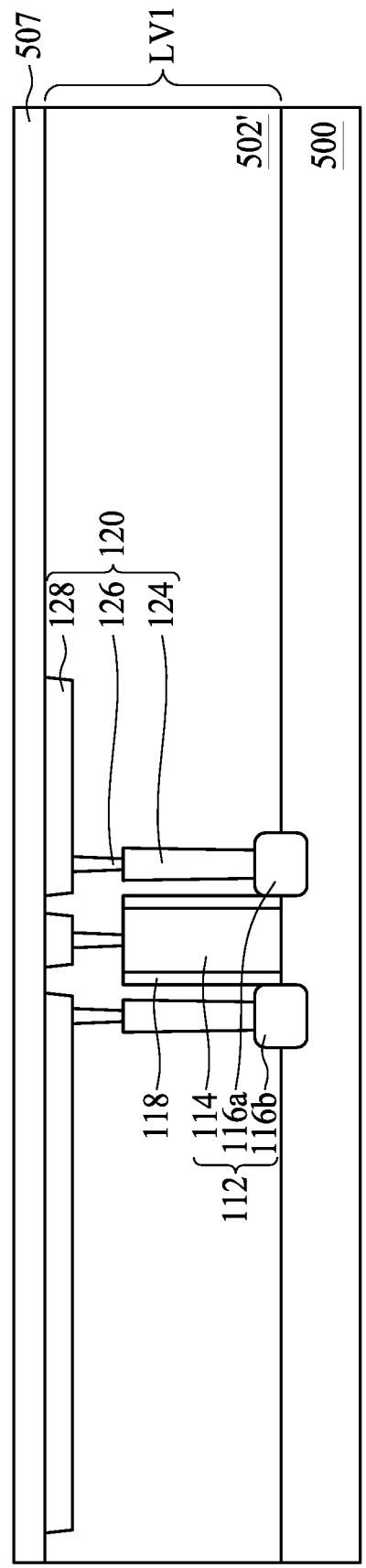

Referring to FIG. 12, an isolation layer 507 is formed by, for example, depositing insulated material on the ILD structure 502' and the conductive lines 128. In some embodiments, a thickness of the isolation layer 507 ranges from about 5 nm to about 700 nm. In some embodiments, the isolation layer 507 may include a silicon oxide (e.g., $SiO_2$), a silicon-nitride based material (e.g., SiON, SiOCN), SiCN, SiN, SiC, $AlO_X$, or the like.

Figure 13:
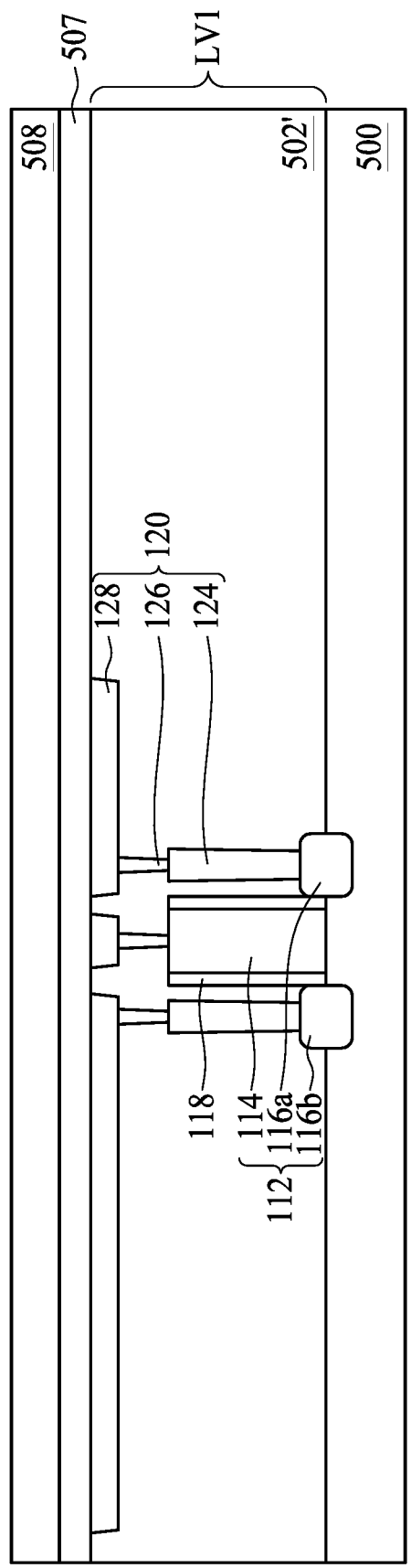

Referring to FIG. 13, a channel material for the device in the level LV2 is formed. In some embodiments, the channel material may include a polysilicon layer 508, which may be formed by depositing polysilicon on the isolation layer 507. In some embodiments, a thickness of the polysilicon layer 508 ranges from about 100 nm to 500 nm. In some embodiments, the channel material for the device in the level LV2 may include amorphous Si, polycrystalline Si, SiGe, or GaN.

Figure 14:
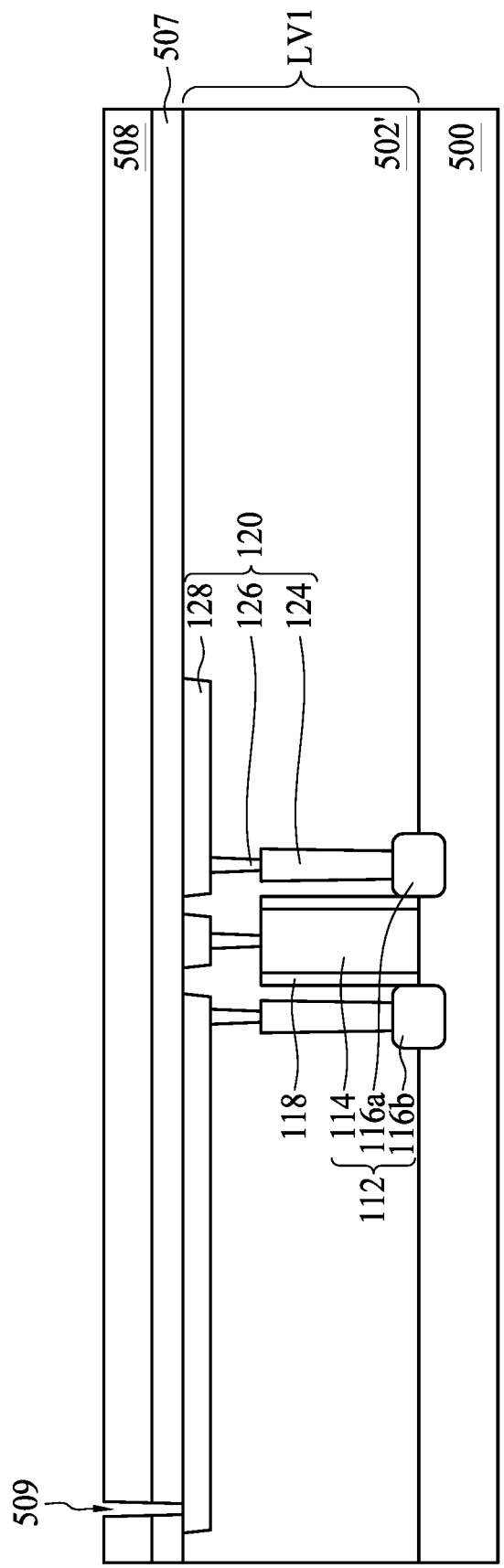

Referring to FIG. 14, an opening 509 is formed in the isolation layer 507 and in the polysilicon layer 508 by patterning the aforesaid layers until the exposure of a portion of the conductive line 128. As previously discussed in FIG. 2, a diameter Dia1 of the lower portion of the TLV 102' (shown in FIG. 15) may be in a range of from about 5 nm to about 2000 nm, depending on the thicknesses of the isolation layer 507 the polysilicon layer 508, therefore, the opening 509 shown in FIG. 14 may also include a diameter similar to the aforesaid range.

Figure 15:
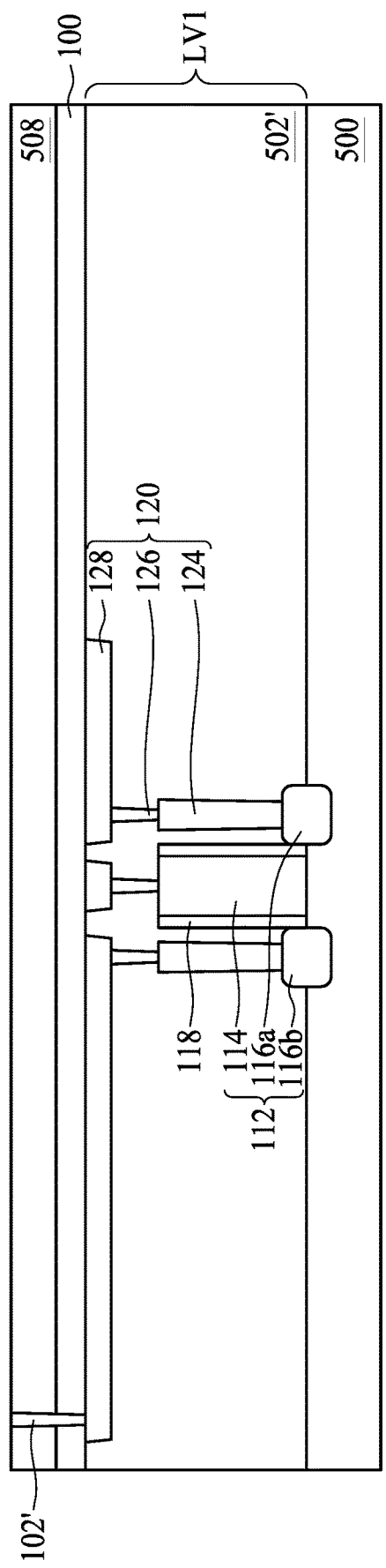
Figure 16:
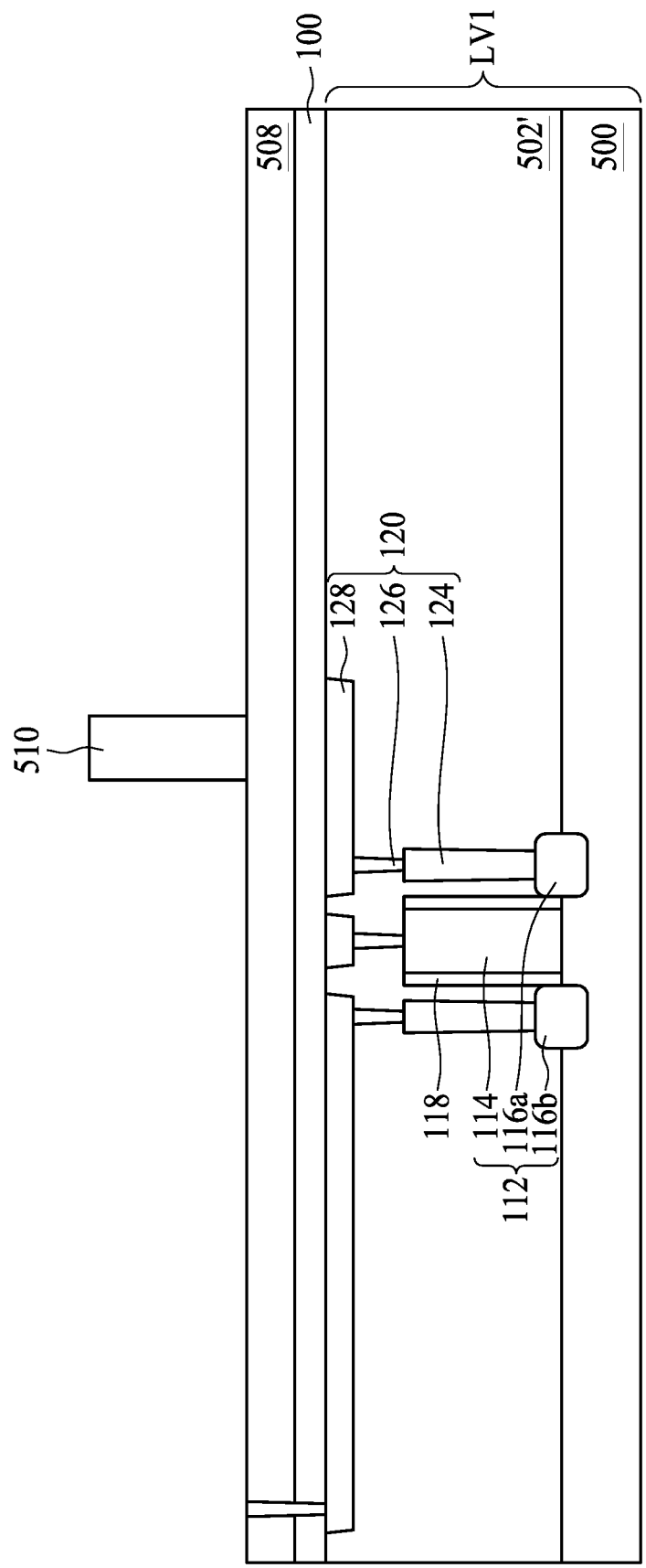

Referring to FIG. 15, a lower portion of the TLV 102' is formed by, for example, depositing conductive material (e.g., Cu, Co, TiN, W) in the opening 509 of the isolation layer 100 and the polysilicon layer 150. The conductive material may be deposited by CVD, PVD, ALD, sputtering, electrochemical plating, electroless plating, or some other deposition process. In some embodiments, the lower portion of the TLV 102' may be a though silicon via (TSV).

A sacrificial gate 510 may be formed over the polysilicon layer 508 by, for example, depositing a processing layer followed by a patterning process. In some embodiments, the sacrificial gate 510 includes polysilicon. The processing layer is formed by, for example, deposition or growth by means of chemical vapor deposition (CVD), physical vapor deposition (PVD), atomic layer deposition (ALD), epitaxy, sputtering, or some other deposition or growth process. Subsequently, the sacrificial gate 510 is formed by patterning the processing layer. In some embodiments, forming the sacrificial gate 510 includes forming a masking layer over/on the processing layer and patterning the processing layer according to the masking layer by an etch (e.g., wet/dry etch). The etch removes unmasked portions of the processing layer, thereby forming the sacrificial gate 510. Subsequently, the masking layer may be stripped away.

In some embodiments, prior to the formation of the sacrificial gate 510, a gate dielectric (not shown in FIG. 16) is formed on the polysilicon layer 508. The gate dielectric may include, for example, an oxide (e.g., $SiO_2$), a high-k dielectric material (e.g., $HfO_2$, $ZrO_2$, or some other dielectric material with a dielectric constant greater than about 3.9), or a combination thereof.

Figure 17:
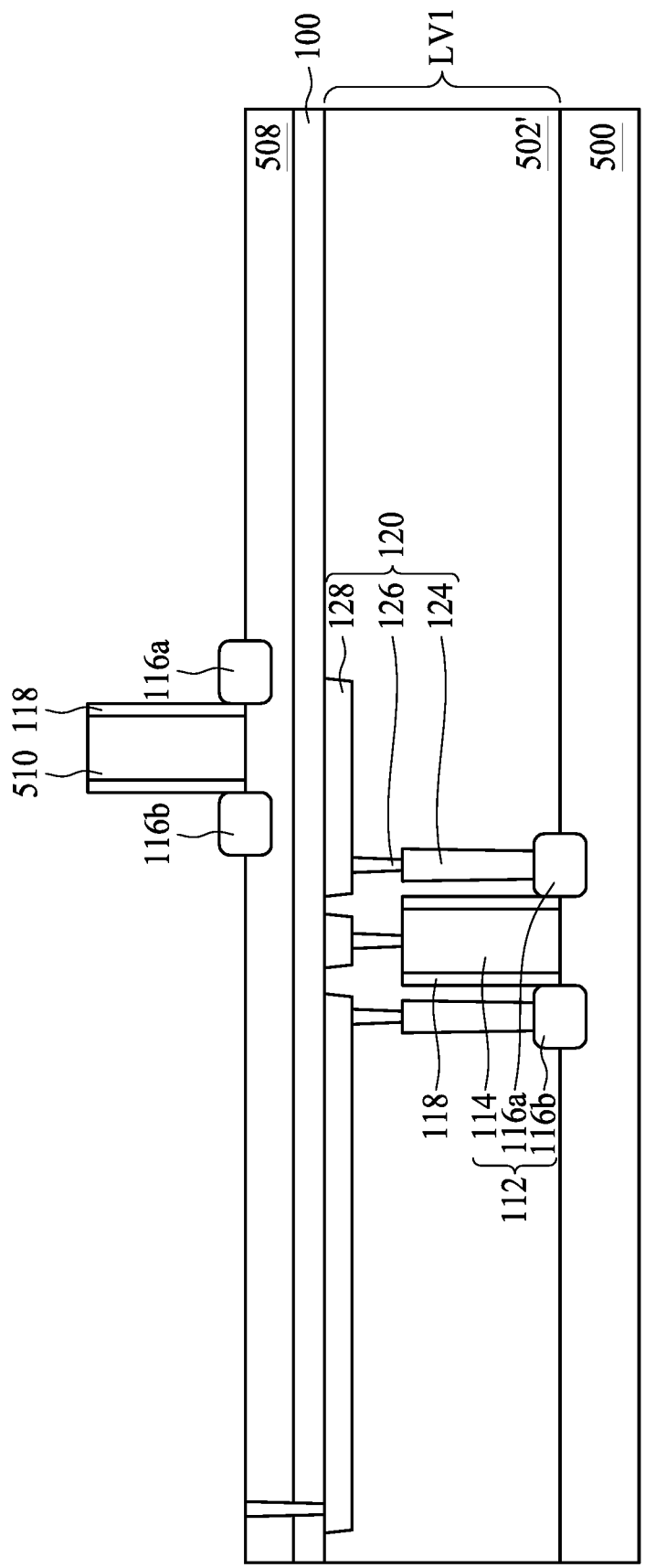

Referring to FIG. 17, a sidewall spacer 118 is formed over the polysilicon layer 508 and along sidewalls of the sacrificial gate 510. A spacer layer may be first blanket deposited by PVD, CVD, ALD, sputtering, or some other deposition process. In some embodiments, the spacer layer may include nitride (e.g., SiN), oxynitride (e.g., $SiO_XN_Y$), or the like. Subsequently, a patterning operation is performed to remove the portion of the spacer layer from horizontal surfaces, leaving the spacer layer along sidewalls of the sacrificial gate 510.

A pair of source/drain regions 116a, 116b are formed at least partially in the polysilicon layer 508 by, for example, forming a recess in the polysilicon layer 508 immediately adjacent to the sacrificial gate 510 and the sidewall spacer 118, and growing an epitaxial layer filling off and protruding over the recess. In some embodiments, the epitaxial growth of the source/drain regions 116a, 116b is in-situ doped. However, the present disclosure is not limited thereto. In some embodiments, the pair of source/drain regions 116a, 116b are formed in the polysilicon layer 508 by, for example, various ion implantation operations.

Figure 18:
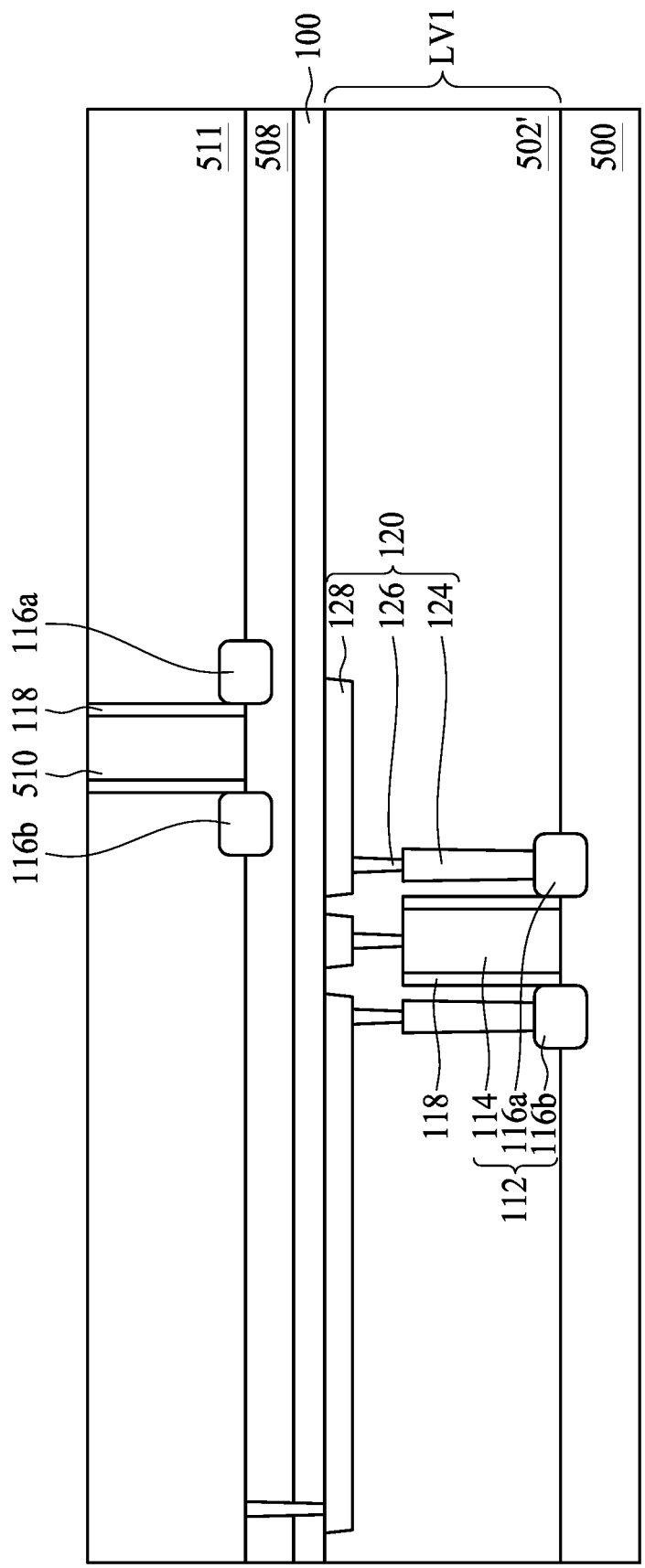

Referring to FIG. 18, a second interlayer dielectric (ILD) structure 511 is formed over the polysilicon layer 508 by, for example, depositing dielectric materials over the polysilicon layer 508, the sidewall spacer 118, and the sacrificial gate 510, followed by a planarization process (e.g., a chemical-mechanical planarization (CMP)) performed on a top of the dielectric materials. The process of dielectric materials deposition may include CVD, PVD, or other suitable operations.

Figure 19:
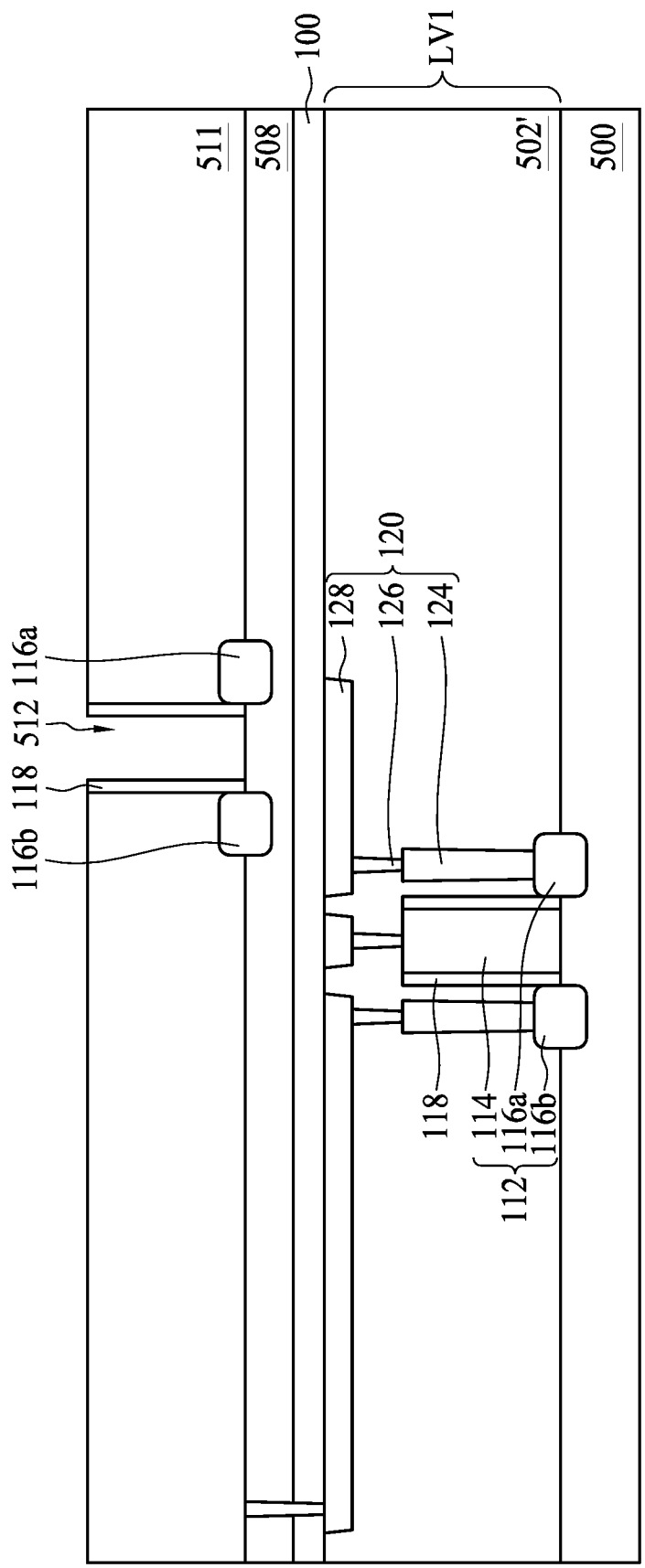

Referring to FIG. 19, an opening 512 is formed by removing the sacrificial gate 510 in FIG. 18, exposing a surface of the polysilicon layer 508. The opening 512 may be defined by inner sidewalls of the sidewall spacer 118 exposing the polysilicon layer 508. In some embodiments, a process for removing the sacrificial gate 510 includes performing an etch (e.g., dry or wet etch) to selectively remove the sacrificial gate 510. In further embodiments, before the etch, a masking layer (not shown) may be formed covering the first ILD structure 511 and the sidewall spacer 118, while leaving the sacrificial gate 510 exposed. Thereafter, the etch is performed with the masking layer in place, thereby selectively removing the sacrificial gate 510. Subsequently, the masking layer may be stripped away.

A gate electrode layer 513 is formed by filling the opening 512 in FIG. 19 and over the second ILD structure 511 with gate electrode material. The gate electrode layer 513 may include work function metal and other conductive materials such as W, Al, Ti, Mo, TiN, TaN, or the like. The gate electrode layer 513 can be a multi-layer structure. In some embodiments, the process of forming the gate electrode layer 513 may include CVD, PVD, ALD, sputtering, electrochemical plating, electroless plating, or some other deposition process. The process of removing the sacrificial gate 510 and replacing with the gate electrode layer 513 as described above may be referred to as a replacement gate process or a gate-last HKMG process.

Figure 20:
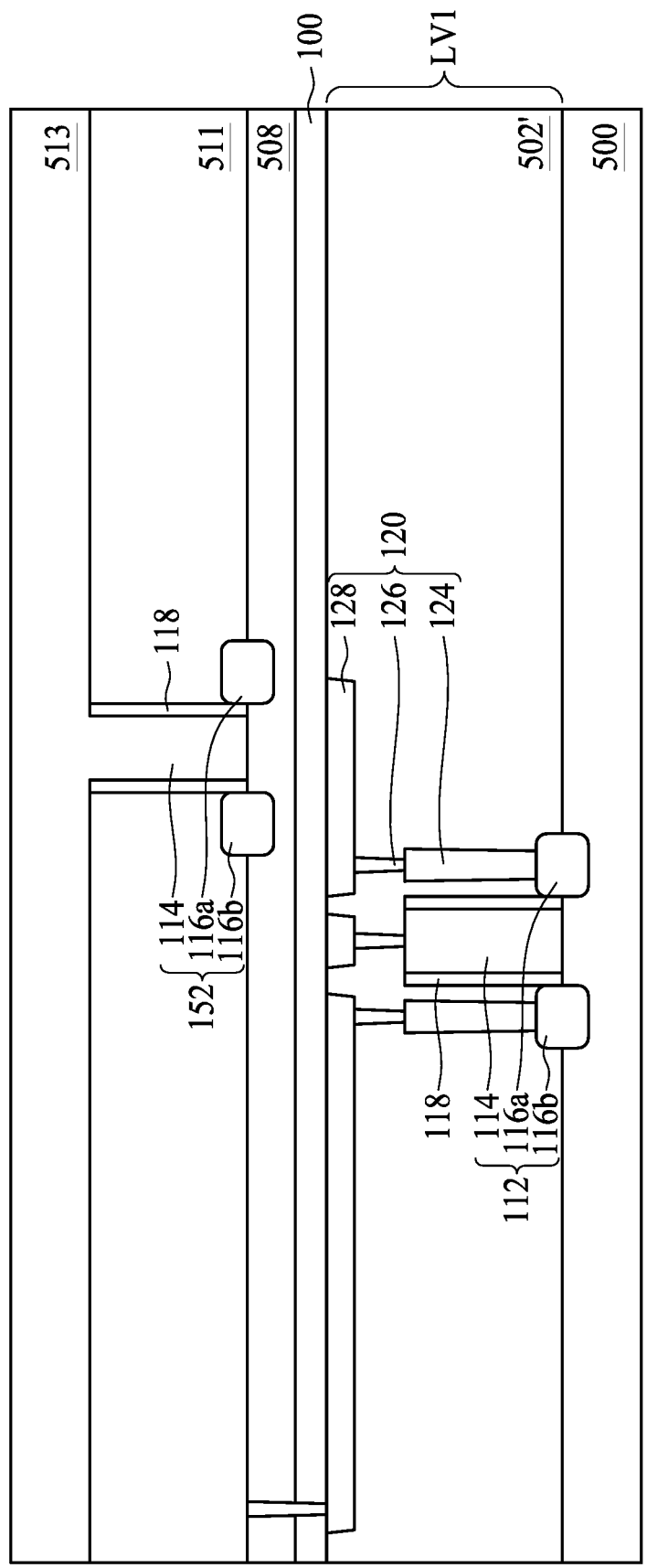
Figure 21:
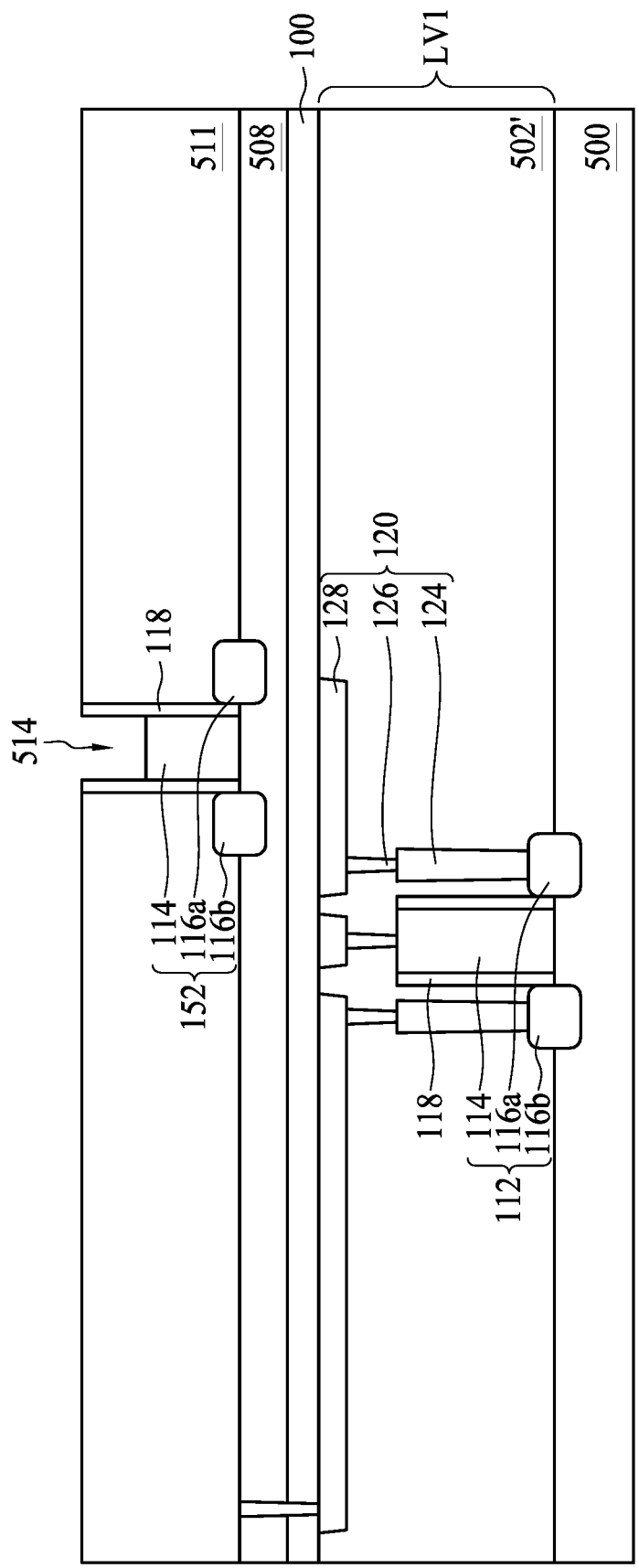

Referring to FIG. 21, a planarization and an etch back operation are subsequently performed on the gate electrode layer 513 in FIG. 20 until a top surface of the gate electrode layer 513 is below a top surface of the first ILD structure 511. In some embodiments, a planarization process (e.g., CMP) is firstly applied on the gate electrode layer 513 in FIG. 20 followed by an etching back operation to further lower a height of the gate electrode layer 513 in FIG. 20 and form a recessed space 514 in the gate trench.

Figure 22:
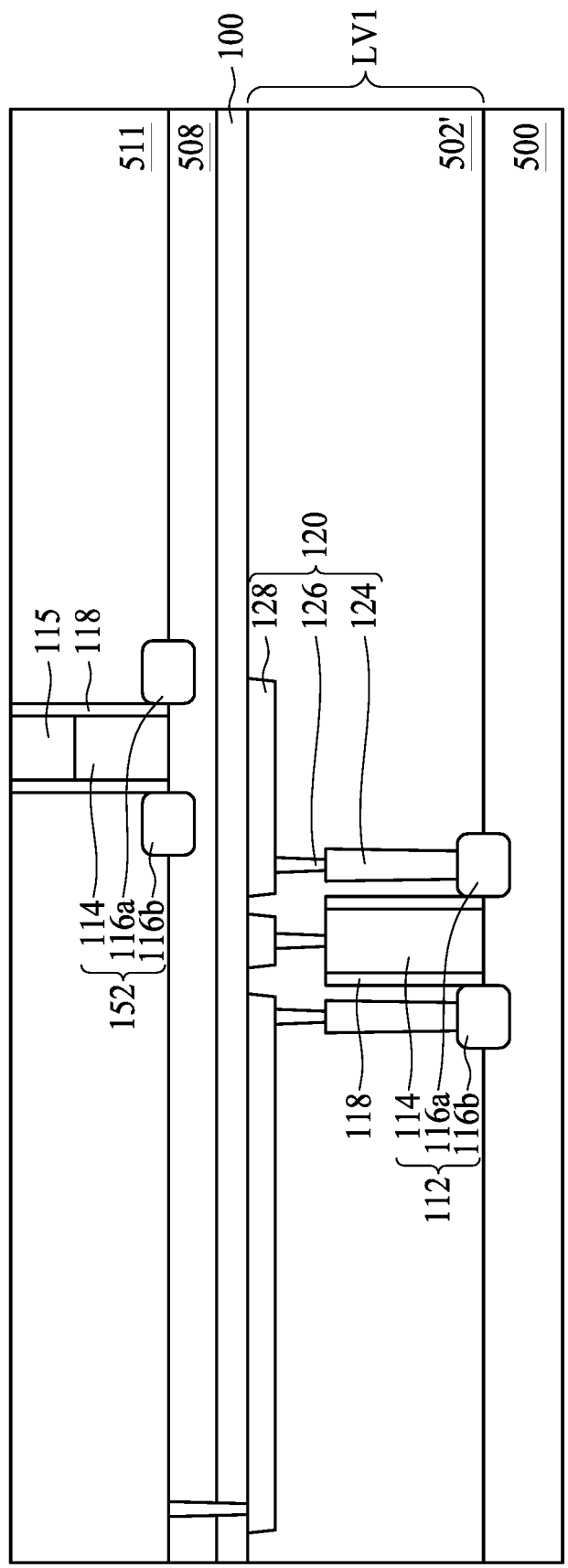

Referring to FIG. 22, a self-aligned contact (SAC) mask 515 is filled in the recessed space 514 in FIG. 21 by, for example, depositing a masking layer in the recessed space 514 followed by a planarization process (e.g., CMP). The masking layer may include silicon nitride, zirconium dioxide, or pure silicon.

Figure 23:
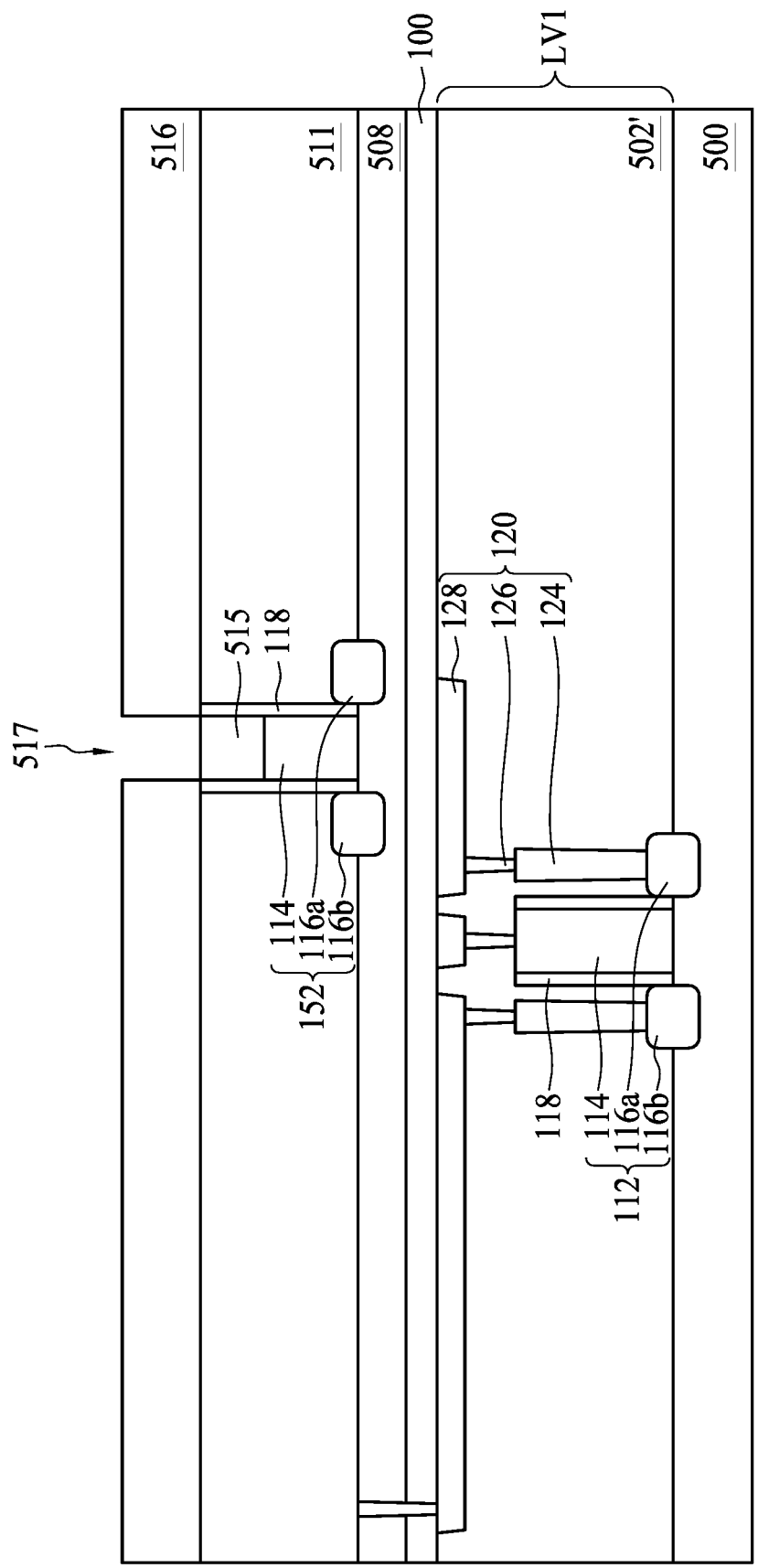

Referring to FIG. 23, a patterned masking layer 516 is formed. The patterned masking layer 516 is formed with an opening 517 exposing a portion of the SAC mask 515. Such portion is designed to form a polarization switching structure 156 (See FIG. 26) in the subsequent operations.

Although depicted in FIG. 23 as exposing the entire width of the SAC mask, the opening 517 may or may not expose an entire width of SAC mask 515, depending on the relative lateral dimension of the polarization switching structure 156.

Figure 24:
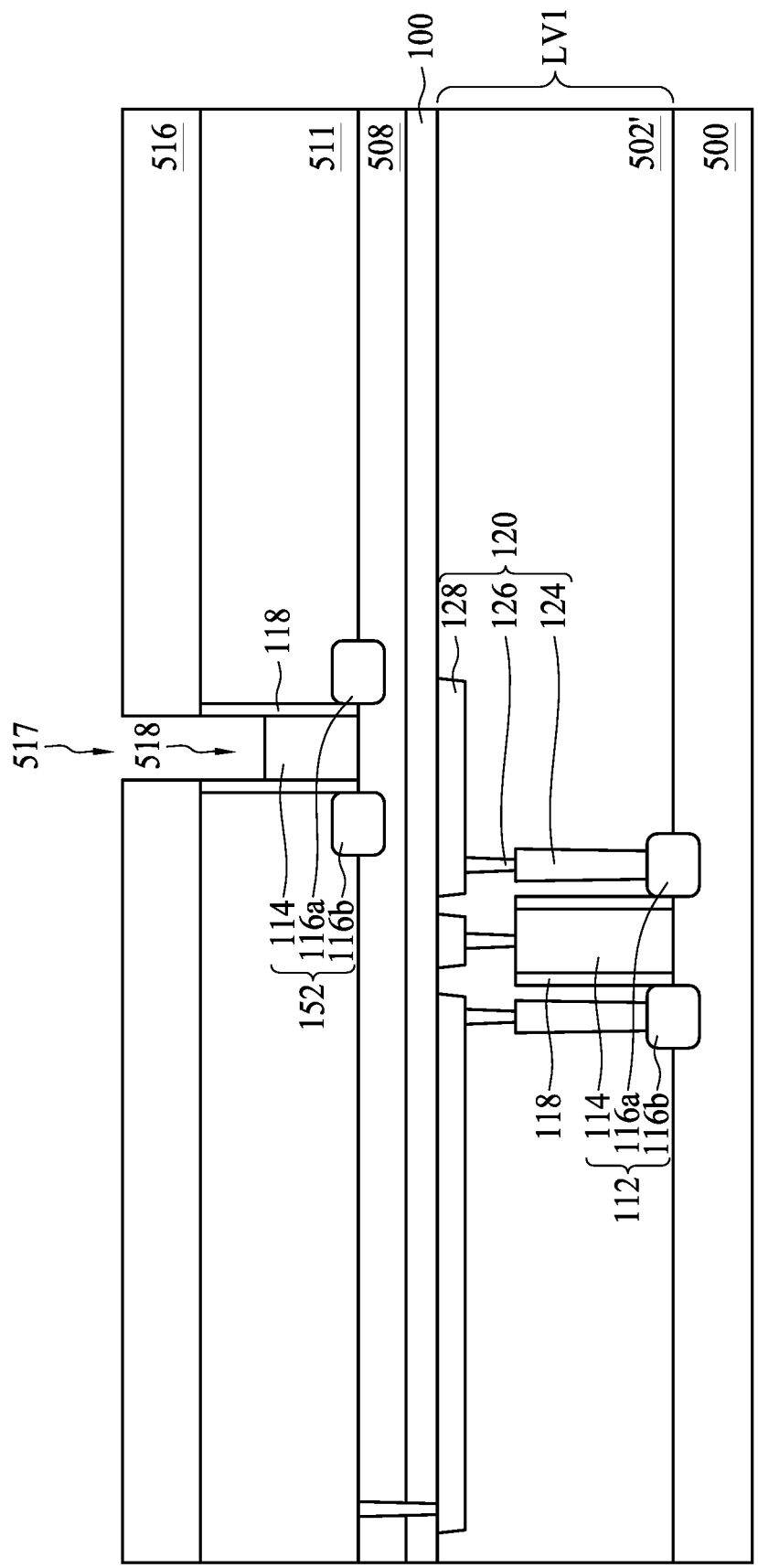

Referring to FIG. 24, at least a portion of the SAC mask 515 is removed, exposing a top surface of the gate 114 to an opening 518.

Figure 25:
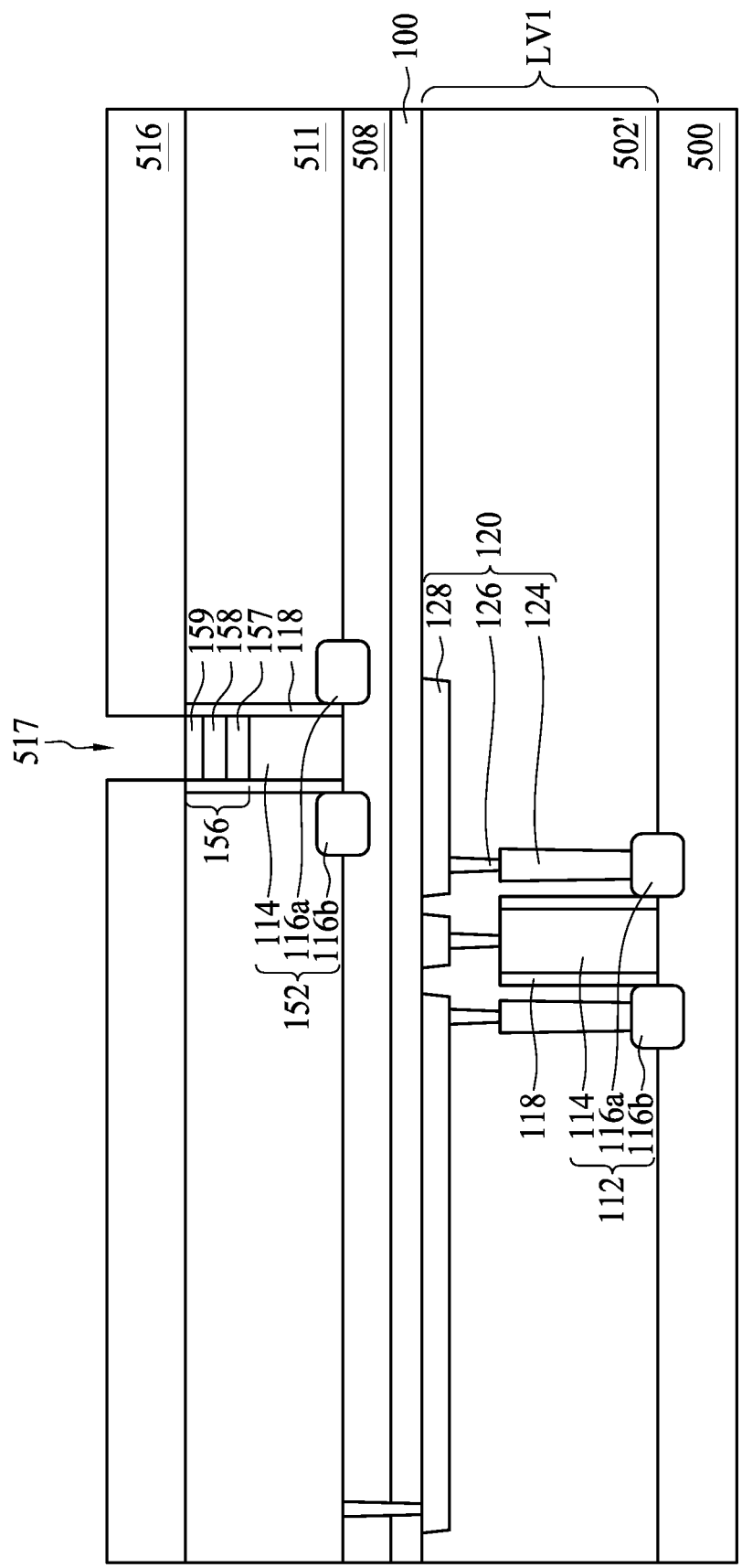

Referring to FIG. 25, the polarization switching structure 156 is formed in the opening 518 in FIG. 24 by filling multiple layers of the polarization switching structure 156. The filling process of the multiple layers of the polarization switching structure 156 may vary depending on various configurations of the polarization switching structure 156.

In some embodiments, a conductive structure 157 of the polarization switching structure 156 is formed by, for example, depositing or growing the conductive structure 157 on the gate 114 followed by an etching back process. In some embodiments, the conductive structure 157 may include, for example, a metal (e.g., Al, Ti, Ta, Au, Pt, W, Ni, Ir, etc.), a metal-nitride (e.g., TiN, TaN, etc.), a metal-oxide (e.g., $IrO_2$), doped polysilicon (e.g., n-type/p-type polysilicon), or the like. In yet further embodiments, the process of deposition or growth may include CVD, PVD, ALD, epitaxy, sol-gel, sputtering, electrochemical plating, electroless plating, or some other deposition or growth process. The conductive structure 157 serves as a bottom electrode of the polarization switching structure 156.

In some embodiments, a ferroelectric structure 158 is formed by, for example, depositing or growing the ferroelectric structure 158 on the conductive structure 157 followed by an etching back process to lower a height of the ferroelectric structure 158. In further embodiments, the ferroelectric structure 158 may comprise, for example, a metal-oxide (e.g., $Hf_XO_Y$), a component-metal-oxide (e.g., $Hf_XSi_YO_Z$, $Hf_XAl_YO_Z$, $Hf_XGd_YO_Z$, $Hf_XZr_YO_Z$, $Hf_XLa_Y O_Z$, $Hf_XSr_Y O_Z$, $Hf_XY_YO_Z$, STO, etc.), a metal-oxynitride (e.g., $Hf_XO_YN_Z$), or the like. In yet further embodiments, the ferroelectric structure 158 may be deposited or grown by CVD, PVD, ALD, epitaxy, sol-gel, sputtering, electrochemical plating, electroless plating, or some other deposition or growth process.

In some embodiments, a conductive structure 159 is formed by, for example, depositing or growing the conductive structure 159 on the ferroelectric structure 158 followed by a planarization process. In further embodiments, the conductive structure 159 may include, for example, a metal (e.g., Al, Ti, Ta, Au, Pt, W, Ni, Ir, etc.), a metal-nitride (e.g., TiN, TaN, etc.), a metal-oxide (e.g., $IrO_2$), doped polysilicon (e.g., n-type/p-type polysilicon), or the like. In yet further embodiments, the process of deposition or growth includes CVD, PVD, ALD, epitaxy, sol-gel, sputtering, electrochemical plating, electroless plating, or some other deposition or growth process. The planarization process can be a chemical-mechanical polishing process. The conductive structure 159 serves as a top electrode of the polarization switching structure 156. At the completion of the formation of the polarization switching structure 156, an FeRAM is embedded in the gate structure of the transistor structure 152.

Figure 26:
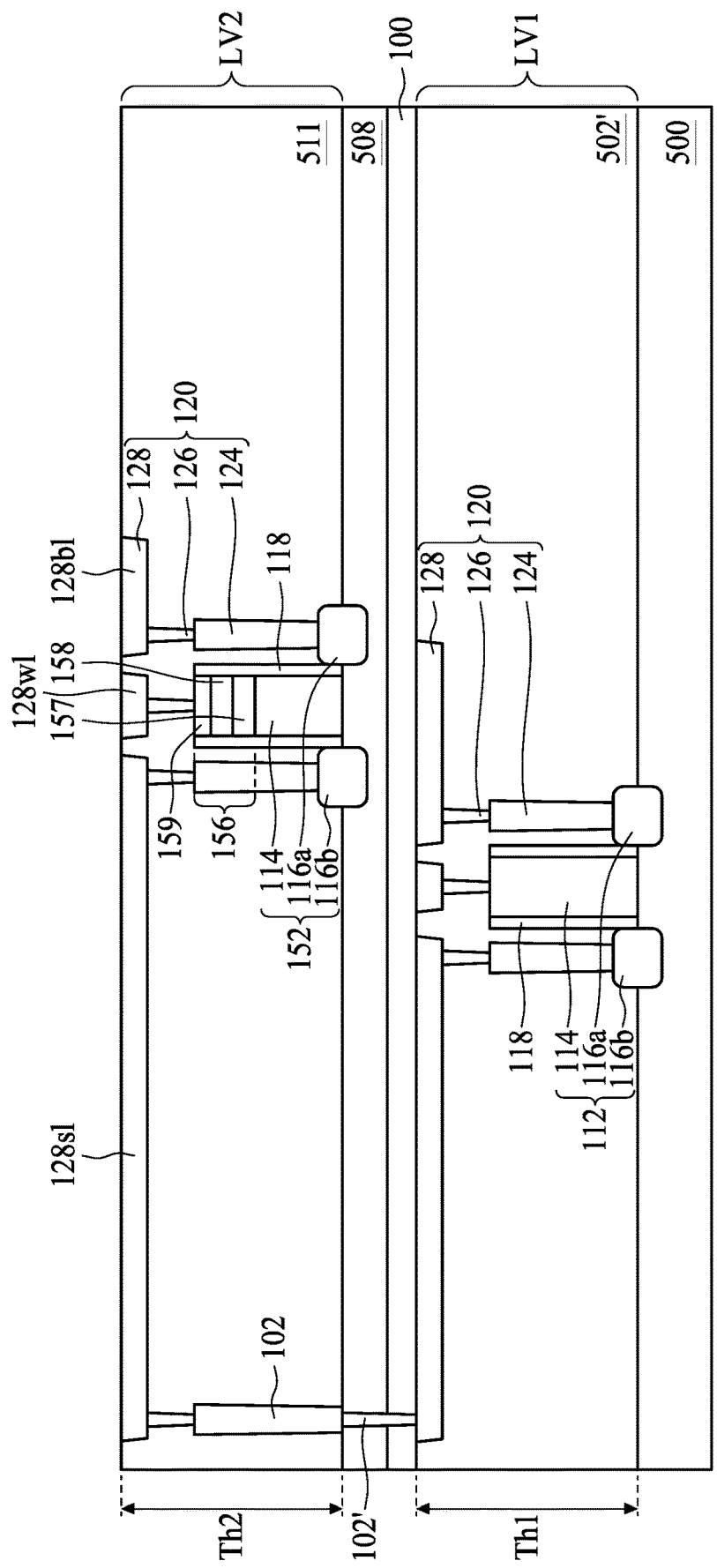

Referring to FIG. 26, an interconnection 120 is formed. A process of forming the interconnection 120 for routing the transistor structure 152 and the polarization switching structure 156 in the level LV2 is the same as that for routing the transistor 112 in the level LV1. Therefore, the detailed descriptions are omitted herein. Operations shown in FIGS. 12 to 26 may be repeated to form a plurality of levels, for example, LV2_1 to LV2_n depicted in FIG. 4.

As illustrated in FIGS. 5 to 11 and in FIGS. 13 to 26, the process for forming the level LV1 is substantially similar to that of forming the layer LV2. As a result, a thickness Th2 of the level LV2 is substantially the same as a thickness Th1 of the level LV1.

The plurality of conductive lines 128, the plurality of conductive vias 126, and the plurality of conductive plugs 124 are electrically coupled together in a predefined manner and configured to provide electrical connections between various memory devices disposed throughout the level LV2. The plurality of conductive lines 128, the plurality of conductive vias 126, the plurality of conductive contacts 124, and the ILD structure 511 may be referred to as an interconnect structure.

In addition, one of the conductive lines 128 denoted as 128w1 may be referred to as a word line. The word line may be electrically coupled to the polarization switching structure 156 via the interconnect structure. Another of the conductive lines 128 denoted as 128b1 may be referred to as a bit line. The bit line may be electrically coupled to a first source/drain region 116a or 116b via the interconnect structure. Still another of the conductive lines 128 denoted as 128s1 and may be referred to as a source line. The source line may be electrically coupled to a second source/drain region 116a or 116b via the interconnect structure.

Some embodiments of the present disclosure provide a semiconductor structure, including: a first layer including a logic device; and a second layer over the first layer, including a first type memory device, a though silicon via (TSV) electrically connecting the logic device and the first type memory device.

Some embodiments of the present disclosure provide a semiconductor structure, including: a bottom layer including a transistor structure; an upper layer comprising a memory structure; and an isolation layer between the bottom layer and the upper layer, wherein the memory structure includes: a gate; a polarization switching structure stacked on the gate; and a conductive region in a channel layer abutting the gate.

Some embodiments of the present disclosure provide a method of forming a semiconductor structure, the method including: forming a transistor structure at a first layer; forming an isolation layer over the first layer; and forming a memory structure comprising a ferroelectric layer over the isolation layer at a second layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor structure, comprising:
a first layer comprising a first substrate, a first dielectric disposed over the first substrate, and a logic device surrounded by the first substrate and the first dielectric;
a second layer over the first layer, comprising a second substrate, a second dielectric disposed over the second substrate, and a first type memory device surrounded by the second substrate and the second dielectric;
an isolation layer, disposed between and contacting the first dielectric and the second substrate;
a first though layer via (TLV) penetrating the second substrate and the isolation layer; and
a second TLV penetrating the second dielectric and landing on a top of the first TLV, wherein a top end of the first TLV is substantially coplanar with a top surface of the second substrate, and a bottom end of the first TLV is substantially coplanar with a bottom surface of the isolation layer, and wherein the logic device and the first type memory device are electrically connected through the first TLV and the second TLV.

2. The semiconductor structure of claim 1, wherein the logic device is at least partially disposed in the first substrate, and the first substrate is a single crystal silicon layer.

3. The semiconductor structure of claim 1, wherein the second substrate is a polysilicon layer.

4. The semiconductor structure of claim 1, wherein the logic device comprises a FinFET structure.

5. The semiconductor structure of claim 1, wherein the first type memory device is integrated in a gate structure of the second layer.

6. The semiconductor structure of claim 1, wherein the first layer further comprises a second type memory device.

7. The semiconductor structure of claim 6, wherein the first type memory device is a ferroelectric memory, and the second type memory device is a static random access memory.

8. The semiconductor structure of claim 3, further comprising a doped region in the polysilicon layer.

9. The semiconductor structure of claim 1, wherein a thickness of the first layer is substantially equal to a thickness of the second layer.

10. The semiconductor structure of claim 1, wherein the first type memory device includes a gate and a ferroelectric layer, and a sidewall of the gate aligns with a sidewall of the ferroelectric layer.

11. The semiconductor structure of claim 1, wherein a height of the first TLV is substantially identical to a thickness of a stack of the isolation layer and the second substrate.

12. A semiconductor structure, comprising:
a bottom layer comprising a first channel layer, a first interlayer dielectric (ILD) layer disposed over the first channel layer, and a transistor structure surrounded by the first channel layer and the first ILD layer;
an upper layer comprising a second channel layer, a second ILD layer disposed over the second channel layer, and a memory structure surrounded by the second channel layer and the second ILD layer;
a spacing layer between the bottom layer and the upper layer, wherein the spacing layer contacts the first ILD layer and the second channel layer; and
a conductive via, wherein at least a portion of the conductive via is laterally surrounded by the spacing layer, and the conductive via is electrically connected to the memory structure and the transistor structure, and
wherein a top end of the conductive via is substantially coplanar with a top surface of the second channel layer, and a bottom end of the conductive via is substantially coplanar with a bottom surface of the spacing layer.

13. The semiconductor structure of claim 12, wherein the bottom layer comprises a static random access memory.

14. The semiconductor structure of claim 12, wherein the memory structure is a ferroelectric memory.

15. The semiconductor structure of claim 12, wherein the spacing layer contacts a plurality of conductive lines disposed at a surface of the first ILD layer.

16. The semiconductor structure of claim 12, wherein the spacing layer comprises one of silicon oxide, silicon-nitride based material, silicon oxynitride, silicon oxycarbide nitride, silicon carbide nitride, silicon carbide, or aluminum oxide.

17. A method of forming a semiconductor structure, the method comprising:
forming a transistor structure surrounded by a first substrate and a first dielectric over the first substrate;
forming an isolation layer on the first dielectric;
forming a second substrate over the isolation layer;
forming a first through layer via (TLV) penetrating the second substrate and the isolation layer;
forming a memory structure over the isolation layer and surrounded by the second substrate contacting the isolation layer and a second dielectric over the second substrate; and
electrically connecting the transistor structure to the memory structure by a second TLV penetrating the second dielectric and landing on a top of the first TLV, wherein an interface between the first TLV and the second TLV is at a level substantially identical to a top surface of the second substrate.

18. The method of claim 17, further comprising defining an active region in the first substrate or the second substrate.

19. The method of claim 17, further comprising:
forming a plurality of conductive lines in the first dielectric prior to forming the isolation layer on the first dielectric, wherein an upper surface of the plurality conductive lines are free from covered by the first dielectric; and
forming the isolation layer on the first dielectric to directly contact the forming an isolation layer on the first dielectric with the isolation layer.

20. The method of claim 17, wherein a top surface of the first TLV is leveled with the top surface of the second substrate prior to forming the memory structure over the isolation layer, and further comprising:
forming an opening in the second dielectric to expose the top surface of the first TLV; and
forming the second TLV in the opening.

* * * * *